(12) United States Patent
Mateus et al.

(10) Patent No.: US 12,316,075 B2
(45) Date of Patent: *May 27, 2025

(54) SYSTEMS INCLUDING ONE OR MORE VCSELs, FOR RECEIVING A THREE DIMENSIONAL (3D) MAP OF AT LEAST A PART OF A BODY OF A USER

(71) Applicant: Bandwidth10, LTD., Berkeley, CA (US)

(72) Inventors: Carlos Fernando Rondina Mateus, Berkeley, CA (US); Christopher Chase, Berkeley, CA (US); Michael C. Y. Huang, Taipei (TW); Murat Serbay, Berlin (DE); Stefano Prandoni, Berlin (DE); Philip Worland, Berkeley, CA (US)

(73) Assignee: Bandwidth 10, LTD., Berkeley, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/207,818

(22) Filed: Jun. 9, 2023

(65) Prior Publication Data

US 2024/0421562 A1     Dec. 19, 2024

Related U.S. Application Data

(63) Continuation-in-part of application No. 18/111,902, filed on Feb. 21, 2023, and a continuation-in-part of application No. 18/107,140, filed on Feb. 8, 2023.
(Continued)

(51) Int. Cl.
*H01S 5/183* (2006.01)
*H01S 5/028* (2006.01)
(Continued)

(52) U.S. Cl.
CPC .......... *H01S 5/18386* (2013.01); *H01S 5/028* (2013.01); *H01S 5/3416* (2013.01);
(Continued)

(58) Field of Classification Search
CPC ........................... H01S 5/18386; H01S 5/3416
See application file for complete search history.

(56) References Cited

U.S. PATENT DOCUMENTS

| | | | | |
|---|---|---|---|---|
| 2006/0227835 | A1* | 10/2006 | Ueki | ................... H01S 5/18341 372/50.124 |
| 2010/0128749 | A1* | 5/2010 | Amann | ............... H01S 5/18308 257/E21.085 |

* cited by examiner

*Primary Examiner* — Tuan N Nguyen
(74) *Attorney, Agent, or Firm* — Paul Davis

(57) ABSTRACT

An apparatus is provided to receive a three dimensional (3D) map of at least a part of a body of a user. A light emitting device is included with tunable VCSEL laser with one or more active regions having quantum wells and barriers. The active regions are surrounded by one or more p-n junctions. The one or more active regions can include a selected shape structure one or more tunnel junction (TJ) 20s provided. One or more apertures are provided with the selected shape structure. One or more buried tunnel junctions (BTJ) or oxide confine the apertures, additional TJ's, planar structures and or additional BTJ's created during a regrowth process that is independent of a first growth process. A VCSEL output is determined in response to an application of the VCSEL laser. The VCSEL laser includes an HCG grating and a bottom DBR. A user monitoring device 100 includes the VCSEL laser. A user monitoring device that includes the VCSEL laser 10. The light emitting device is included in a camera of a communication device.

20 Claims, 33 Drawing Sheets

Related U.S. Application Data

(60) Provisional application No. 63/432,050, filed on Dec. 12, 2022, provisional application No. 63/415,268, filed on Oct. 11, 2022, provisional application No. 63/402,556, filed on Aug. 31, 2022, provisional application No. 63/402,546, filed on Aug. 31, 2022, provisional application No. 63/402,553, filed on Aug. 31, 2022, provisional application No. 63/402,560, filed on Aug. 31, 2022.

(51) Int. Cl.
*H01S 5/34* (2006.01)
*H01S 5/343* (2006.01)
*H04N 13/254* (2018.01)
*H04N 13/271* (2018.01)

(52) U.S. Cl.
CPC ....... *H01S 5/34306* (2013.01); *H04N 13/254* (2018.05); *H04N 13/271* (2018.05); *H01S 2302/00* (2013.01)

12 - Bottom DBR mirror - n or p doping
14 - Active region (≡16 -QWs and barriers)
18 - p-n junction across active region 14
20 - Tunnel Junction 12 - Bottom DBR mirror - n or p doping
14 - Active region (≡16 -QWs and barriers)
18 - p-n junction across active region 14
22 - Spacing layers - p or n doping)

MANUFACTURING SEQUENCE

- Growth of bottom VCSEL - see below
- Next:
  - Timed etch of TJ, leaving some p++- target is 5-10nm
  - Regrowth of top VCSEL from etched seed layer ~40 nm thick TJ
AlGaInAs:C 12nm
AlInAs:C 34nm
Active Region Bottom DBR mirror
InP seed Wafer

MANUFACTURING SEQUENCE

- Timed slow etch with $H_2SO_4:H_2O_2:H_2O = 1:8:1036$, or diluted $H_3PO_4$, or diluted HF
  . ~42nm/minute Leave ~5-10nm of p++    3-20 um ~40 nm thick TJ
AlGaInAs:C 12nm
AlInAs:C 34nm
Active Region Bottom DBR mirror
Inp seed Wafer 1st Growth Mesa etch ALD wall protection
(for further selective etch on release, reliability)

HCG/MEMS Litho/Dry Etch

M2 - Open via access to bottom DBR contact

Cross Section

Top View

Portable Multiplication Device

SYSTEMS INCLUDING ONE OR MORE VCSELs, FOR RECEIVING A THREE DIMENSIONAL (3D) MAP OF AT LEAST A PART OF A BODY OF A USER

CLAIMS OF PRIORITY AND CROSS REFERENCES TO RELATED APPLICATIONS

This patent application claims priority from U.S. Provisional Application No. 63/402,546, titled 'HCG TUNABLE VCSEL WITH FULLY OXIDIZED BOTTOM DBR (GAAS BASED VCSEL)', filed on Aug. 31, 2022; U.S. Provisional Application No. 63/402,553, titled 'HCG TUNABLE VCSEL WITH OPTICAL CONFINEMENT VIA STEP INDEX AND REGROWTH', filed on Aug. 31, 2022; U.S. Provisional Application No. 63/402,556, titled 'HCG TUNABLE VCSEL WITH ELECTRICAL AND OPTICAL CONFINEMENT VIA ETCHED POST', filed on Aug. 31, 2022; U.S. Provisional Application No. 63/402,560, titled 'FLIP CHIP TUNABLE VCSEL WITH HCG ON SI SUBMOUNT', filed on Aug. 31, 2022; U.S. Provisional Application No. 63/415,268, titled 'LIGHT EMITTING DEICE WITH DETEMINABLE SHAPE OF OUTPUT BEAM', filed on Oct. 11, 2022 and U.S. Provisional Application No. 63/432,050, titled 'HCG TUNABLE VCSEL WITH INTEGRATED DETECTOR IN THE SACRIFICIAL LAYER', filed on Dec. 12, 2022; is a continuation in part of U.S. Non-Provisional patent application Ser. No. 18/107,140, titled 'LIGHT EMITTING DEVICE WITH DETEMINABLE SHAPE OF OUTPUT BEAM', filed on Feb. 8, 2023 and U.S. Non-Provisional patent application Ser. No. 18/111,902, titled 'HCG TUNABLE VCSEL WITH ELECTRICAL AND OPTICAL CONFINEMENT VIA ETCHED POST' filed on Feb. 21, 2023.

BACKGROUND

Field of the Invention

This invention relates generally to systems receiving a three dimensional (3D) map of at least a part of a body of a user, more particularly to systems including one or more VCSEls, and receiving a three dimensional (3D) map of at least a part of a body of a user.

Brief Description of the Related Art

Hand tracking devices have used s image sensors that capture three-dimensional scene information that includes at least a hand of a human user. The image sensors capture the hand images with sufficient resolution to enable the fingers and their respective positions to be distinguished. The image sensors typically capture images of other parts of the user's body, as well, or possibly all of the body, and may have either zoom capabilities or a dedicated sensor with enhanced magnification to capture images of the hand with the desired resolution. In some embodiments, the image sensors also capture 2D color video images of the hand and other elements of the scene. In some embodiments, the image sensors are used in conjunction with other image sensors to capture the physical environment of the scene, or serve as the image sensors that capture the physical environment of the scene. In some embodiments, the image sensors are positioned relative to the user or the user's environment in a way that a field of view of the image sensors or a portion thereof is used to define an interaction space in which hand movement captured by the image sensors are treated as inputs to a controller.

Image sensors can output a sequence of frames containing 3D map data (and possibly color image data, as well) to a controller, which extracts high-level information from the map data. This high-level information is typically provided vian Application Program Interface (API) to an application running on the controller, which drives a display generation component.

There is a need for improved systems and methods to receive a three dimensional (3D) map of at least a part of a body of a user.

SUMMARY

An object of the present invention is to provide an apparatus to receive a three dimensional (3D) map of at least a part of a body of a user.

Another object of the present invention is to provide a mobile device to identify a direction of a user's gaze by analyzing light reflected off an element of the eye.

Another object of the present invention is to provide a mobile device, with one or more VCSEL's, to identify a direction of a user's gaze by analyzing light reflected off an element of the eye.

Yet another object of the present invention is to provide a mobile device, with one or more VCSEL's, configured to extract 3D coordinates of a user's head by segmenting a 3D map in order to extract a position of the head along a horizontal axis, a vertical axis, and a depth axis.

These and other objects of the present invention are achieved in an apparatus to receive a three dimensional (3D) map of at least a part of a body of a user. A light emitting device is included with tunable VCSEL laser with one or more active regions having quantum wells and barriers. The active regions are surrounded by one or more p-n junctions. The one or more active regions can include a selected shape structure one or more tunnel junction (TJ) $20s$ provided. One or more apertures are provided with the selected shape structure. One or more buried tunnel junctions (BTJ) or oxide confine the apertures, additional TJ's, planar structures and or additional BTJ's created during a regrowth process that is independent of a first growth process. A VCSEL output is determined in response to an application of the VCSEL laser. The VCSEL laser includes an HCG grating and a bottom DBR. A user monitoring device 100 includes the VCSEL laser. A user monitoring device that includes the VCSEL laser 10. The light emitting device is included in a camera of a communication device.

DETAILED DESCRIPTION

Figure 1A:
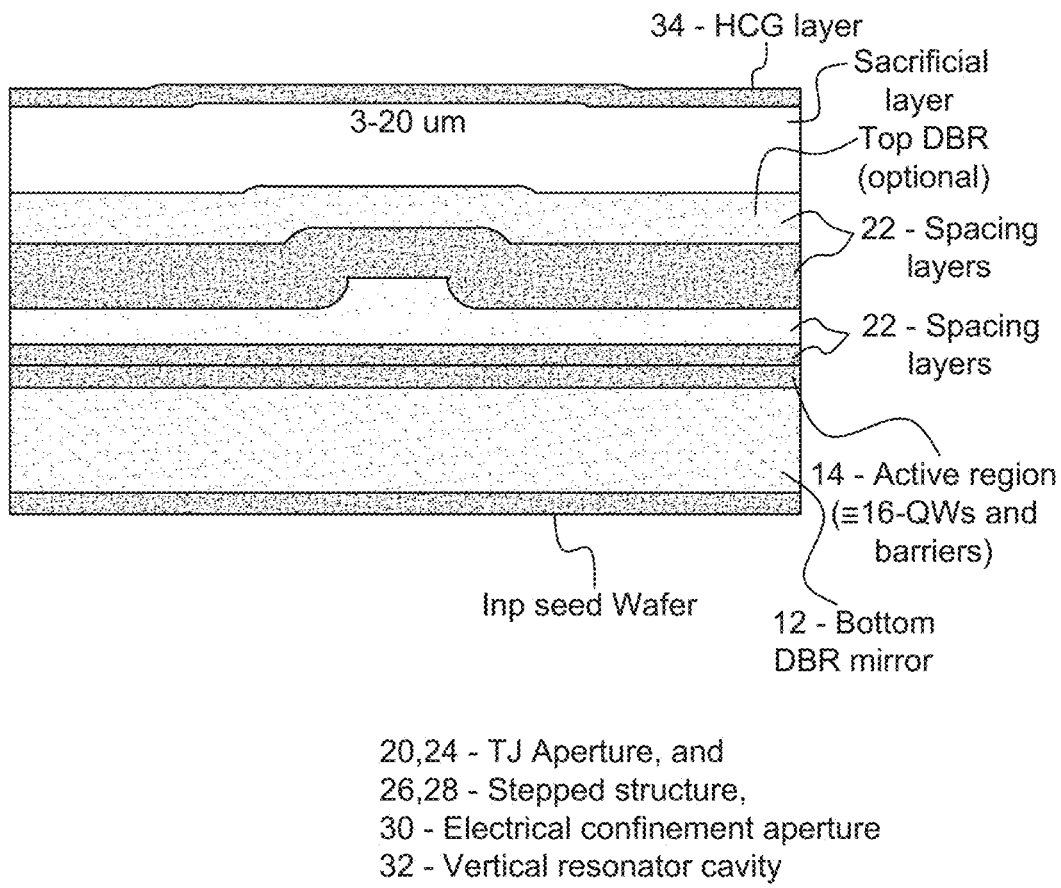
FIG. 1A illustrates one embodiment of a light emitting device of the present invention with a seed layer and HCG layer.
Figure 1B:
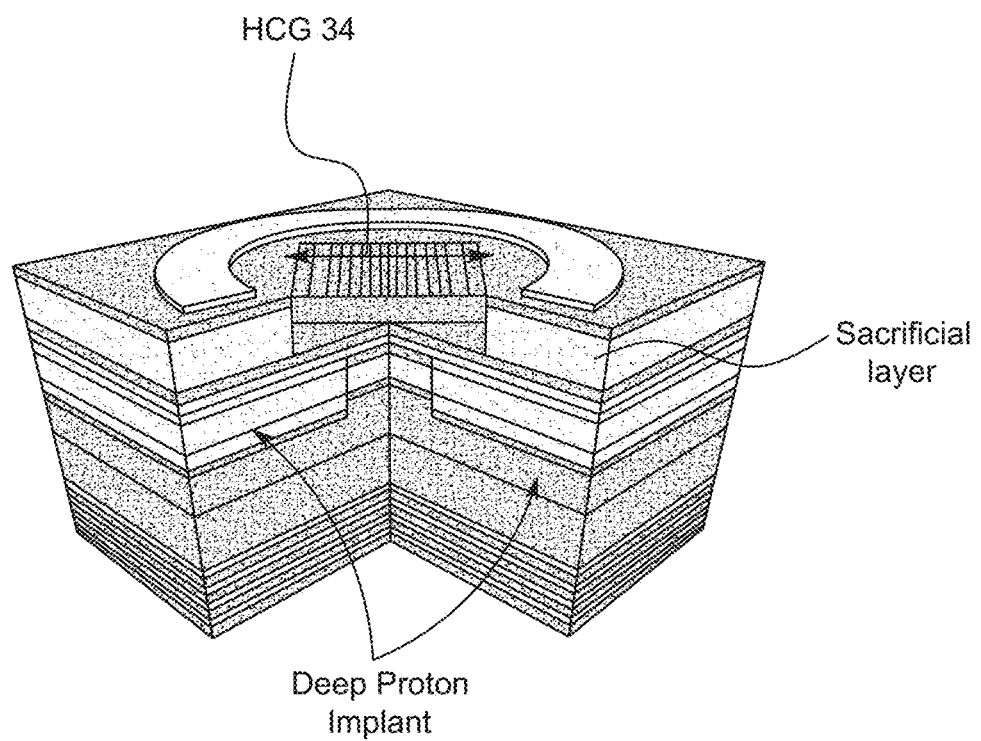
FIG. 1B illustrates an embodiment of FIG. 1A with a sacrificial layer and deep proton implant.
Figure 1C:
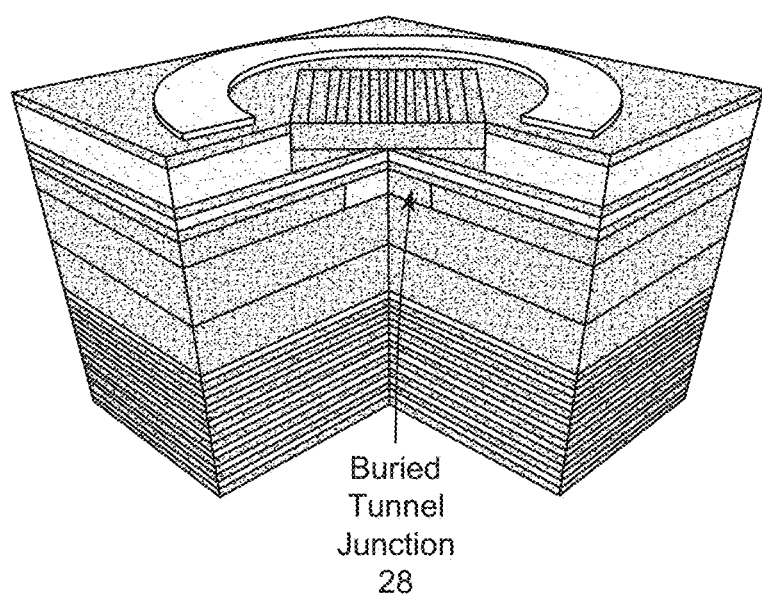
FIG. 1C illustrates the FIG. 1B embodiment with the deep proton implant but with a buried tunnel junction.
Figure 1D:
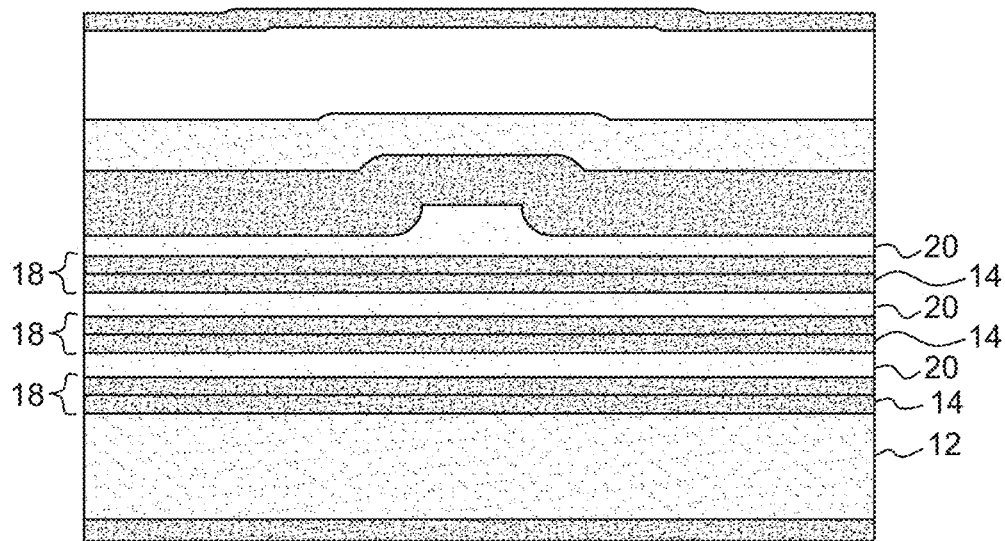
FIG. 1D illustrates one embodiment of a light emitting device of the present invention with multiple-junction HCG tunability.

As used herein, the term engine refers to software, firmware, hardware, or other component that can be used to effectuate a purpose. The engine will typically include software instructions that are stored in non-volatile memory (also referred to as secondary memory) and a processor with instructions to execute the software. When the software instructions are executed, at least a subset of the software instructions can be loaded into memory (also referred to as primary memory) by a processor. The processor then executes the software instructions in memory. The processor may be a shared processor, a dedicated processor, or a combination of shared or dedicated processors. A typical program will include calls to hardware components (such as I/O devices), which typically requires the execution of drivers. The drivers may or may not be considered part of the engine, but the distinction is not critical.

As used herein, the term database is used broadly to include any known or convenient means for storing data, whether centralized or distributed, relational or otherwise.

As used herein a mobile device includes, but is not limited to, a cell phone, such as Apple's iPhone®, other portable electronic devices, such as Apple's iPod Touches®, Apple's iPads®, and mobile devices based on Google's Android® operating system, and any other portable electronic device that includes software, firmware, hardware, or a combination thereof that is capable of at least receiving a wireless signal, decoding if needed, and exchanging information with a server. Typical components of mobile device may include but are not limited to persistent memories like flash ROM, random access memory like SRAM, a camera, a battery, LCD driver, a display, a cellular antenna, a speaker, a BLUETOOTH® circuit, and WIFI circuitry, where the persistent memory may contain programs, applications, and/or an operating system for the mobile device. For purposes of this application, a mobile device is also defined to include a fob, and its equivalents.

As used herein, the term "computer" is a general-purpose device that can be programmed to carry out a finite set of arithmetic or logical operations. Since a sequence of operations can be readily changed, the communication device can solve more than one kind of problem. A communication device can include of at least one processing element, typically a central processing unit (CPU) and some form of memory. The processing element carries out arithmetic and logic operations, and a sequencing and control unit that can change the order of operations based on stored information. Peripheral devices allow information to be retrieved from an external source, and the result of operations saved and retrieved. Communication device also includes a graphic display medium.

As used herein, the term "internet" is a global system of interconnected computer networks that use the standard Network Systems protocol suite (TCP/IP) to serve billions of users worldwide. It is a network of networks that consists of millions of private, public, academic, business, and government networks, of local to global scope, that are linked by a broad array of electronic, wireless and optical networking technologies. The internet carries an extensive range of information resources and services, such as inter-linked hypertext documents of the World Wide Web (WWW) and the infrastructure to support email. The communications infrastructure of the internet consists of its hardware components and a system of software layers that control various aspects of the architecture.

As used herein, the term "extranet" is a computer network that allows controlled access from the outside. An extranet can be an extension of an organization's intranet that is extended to users outside the organization in isolation from all other internet users. An extranet can be an intranet mapped onto the public internet or some other transmission system not accessible to the general public, but managed by more than one company's administrator(s). Examples of extranet-style networks include but are not limited to:

LANs or WANs belonging to multiple organizations and interconnected and accessed using remote dial-up LANs or WANs belonging to multiple organizations and interconnected and accessed using dedicated lines Virtual private network (VPN) that is comprised of LANs or WANs belonging to multiple organizations, and that extends usage to remote users using special "tunneling" software that creates a secure, usually encrypted network connection over public lines, sometimes vian ISP.

As used herein, the term "Intranet" is a network that is owned by a single organization that controls its security policies and network management. Examples of intranets include but are not limited to: s LAN, a Wide-area network (WAN) that is comprised of a LAN that extends usage to remote employees with dial-up access, a WAN that is comprised of interconnected LANs using dedicated communication lines, a Virtual private network (VPN) that is comprised of a LAN or WAN that extends usage to remote employees or networks using special "tunneling" software that creates a secure, usually encrypted connection over public lines, sometimes vian Internet Service Provider (ISP).

For purposes of the present invention, the Internet, extranets and intranets collectively are referred to as ("Network Systems").

As used herein "Cloud Application" refers to cloud application services or "software as a service" (SaaS) which deliver software over the Network Systems eliminating the need to install and run the application on a device.

As used herein "Cloud Platform" refers to a cloud platform services or "platform as a service" (PaaS) which deliver a computing platform and/or solution stack as a service, and facilitates the deployment of applications without the cost and complexity of obtaining and managing the underlying hardware and software layers.

As used herein "Cloud System" refers to cloud infrastructure services or "infrastructure as a service" (IAAS) which deliver computer infrastructure as a service with raw block storage and networking.

As used herein "Server" refers to server layers that consist of computer hardware and/or software products specifically designed for the delivery of cloud services.

As used herein, the term "user monitoring": (i) cardiac monitoring, which generally refers to continuous electrocardiogramith assessment of the user's condition relative to their cardiac rhythm. A small monitor worn by an ambulatory user for this purpose is known as a Holter monitor. Cardiac monitoring can also involve cardiac output monitoring vian invasive Swan-Ganz catheter (ii) Hemodynamic monitoring, which monitors the blood pressure and blood flow within the circulatory system. Blood pressure can be measured either invasively through an inserted blood pressure transducer assembly, or noninvasively with an inflatable blood pressure cuff. (iii) Respiratory monitoring, such as: pulse oximetry which involves measurement of the saturated percentage of oxygen in the blood, referred to as $SpO2$, and measured by an infrared finger cuff, capnography, which involves $CO2$ measurements, referred to as $EtCO2$ or end-tidal carbon dioxide concentration. The respiratory rate monitored as such is called AWRR or airway respiratory rate). (iv) respiratory rate monitoring through a thoracic transducer belt, an ECG channel or via capnography, (v) Neurological monitoring, such as of intracranial pressure. Special user monitors can incorporate the monitoring of brain waves electroencephalography, gas anesthetic concentrations, bispectral index (BIS), and the like, (vi) blood glucose monitoring using glucose sensors. (vii) childbirth monitoring with sensors that monitor various aspects of childbirth. (viii) body temperature monitoring which in one embodiment is through an adhesive pad containing a thermoelectric transducer. (ix) stress monitoring that can utilize sensors to provide warnings when stress levels signs are rising before a human can notice it and provide alerts and suggestions. (x) epilepsy monitoring. (xi) toxicity monitoring, (xii) general lifestyle parameters, (xiii) sleep, including but not limited to: sleep patterns, type of sleep, sleep disorders, movement during sleep, waking up, falling asleep, problems with sleep, habits during, before and after sleep, time of sleep, length sleep in terms of the amount of time for each sleep, body activities during sleep, brain patterns during sleep and the like (xiv) body gesture, movement and motion (xv) body habits, (xvi) and the like.

Figure 2:
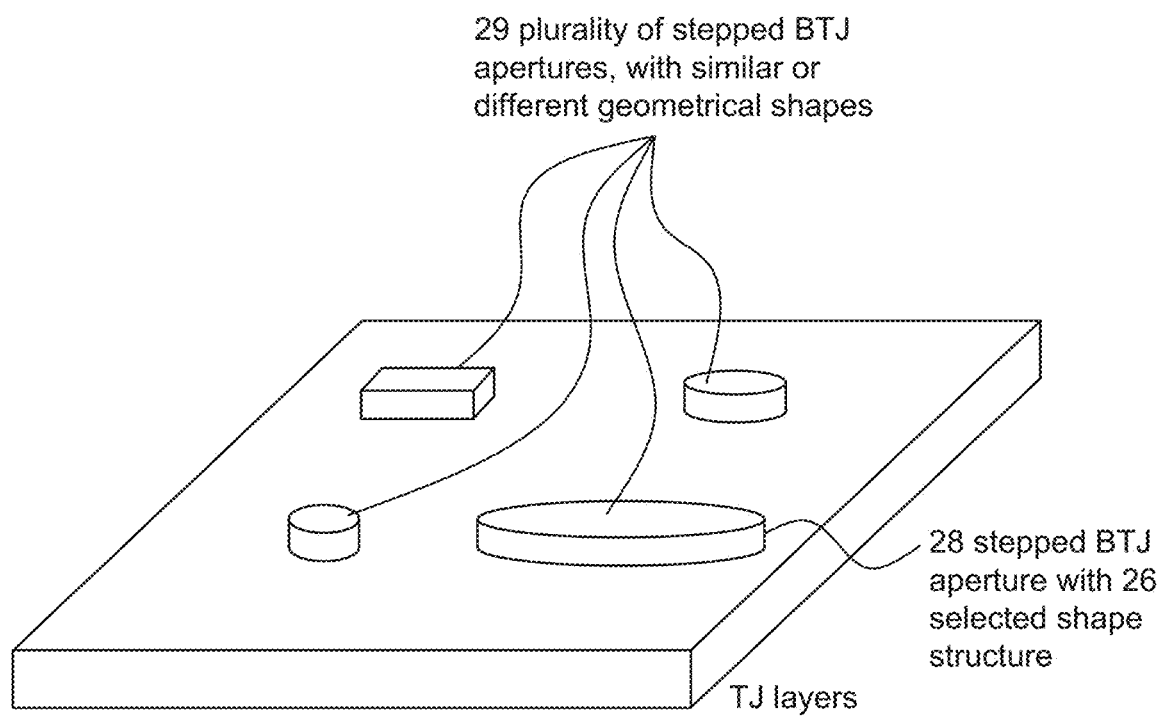
FIG. 2 illustrates an embodiment with several stepped BTJ apertures with different geometric shapes.
Figure 3:
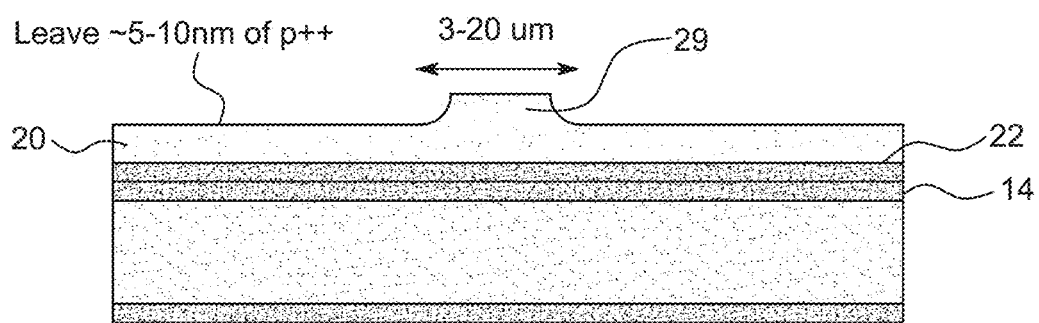
FIG. 3 illustrates a shaped structure, which can be a plateau, of the present invention.

In one embodiment, illustrated in FIGS. 1A-1D, a light emitting device 10 includes:

a first mirror 12 ("DBR"), which can be a bottom mirror, and one or more active regions 14. A first active region 14 is adjacent to the first mirror 12. The one or more active regions 14 are stacked in the light emitting device 10 to provide for a selected shape structure 26 with an active region that includes a tunnel junction (TJ) 20, another active region 14, another TJ 20 and so on. As illustrated in FIG. 2 there can be a repetition of active regions 14 and TJ's 20, providing a plurality of successive active regions 14 with TJ's 20, as illustrated in FIG. 2. Each active region 14 includes quantum wells and barriers 16 surrounded by one or more p-n junctions 18, see FIG. 3. As previously recited, one or more TJ's 20 are provided. Each of an aperture 24 is provided with a selected shaped structure 26, illustrated in FIG. 4. As non-limiting examples, the selected shape structure 26 can be open or closed, geometric or non-geometric shape, and the like. The shape of the selected shape structure 26 is based on a desired optical transmission function for a desired application, as shown in FIG. 4.

Figure 4:
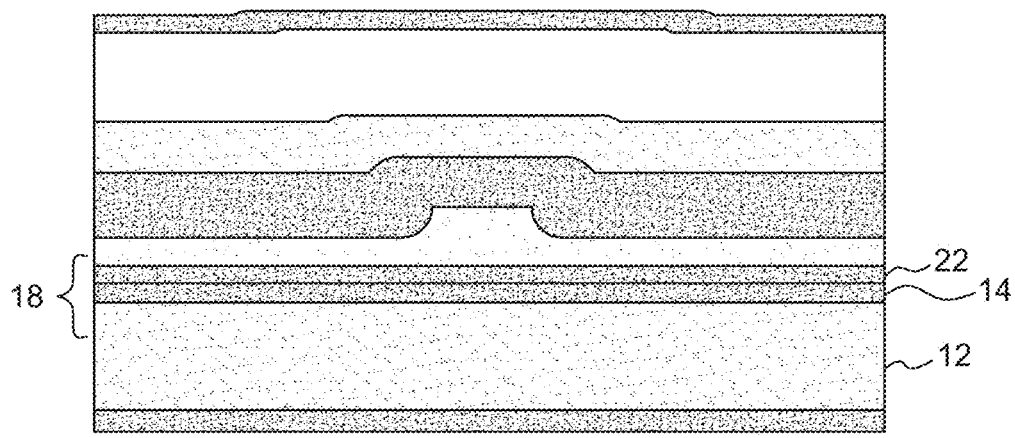
FIG. 4 illustrates one embodiment of a P-N junction.

In one embodiment, the selected shape structure 26 is a stepped structure, see FIG. 4. The degree of the stepping can be at a variety of different angles, as determined by the etching process. The selected shape structure 26 can be substantially any geometry, including but not limited to a four corned star, circular, square and the like. As a non-limiting example, the selected shape structure 26 can be created using an inverse design. The selected shape structure 26 is selected in order to create an optimal desired far field pattern depending on the desired application. As a non-limiting example, the selected shape structure 26 is formed by etching.

In one embodiment, a first growth is used to create the bottom mirror 12, TJs 20, active regions 14, and the like. In one embodiment, a selected geometric configuration buried tunnel junction 28 is created during a regrowth process. The light emitting device 10 is created by the first growth, followed by a second or regrowth of the first growth. The first growth creates a planar structure. Additional BTJ's 28 are created from second, third and the like regrowth's. The creation of multiple BTJ's is formed during multiple regrowth processes. All of these regrowth's are independent of the first growth process.

An area 30 is defined by the one or more BTJ's 28, additional TJ's 20, planar structures and/or addition BTJ's 28. A vertical resonator cavity 32 is defined by a second mirror over the electrical confinement aperture 30, see FIG. 6. A high contract grating (HCG) 34 operates as a second mirror positioned at the top of the vertical resonator cavity 32.

Figure 5:
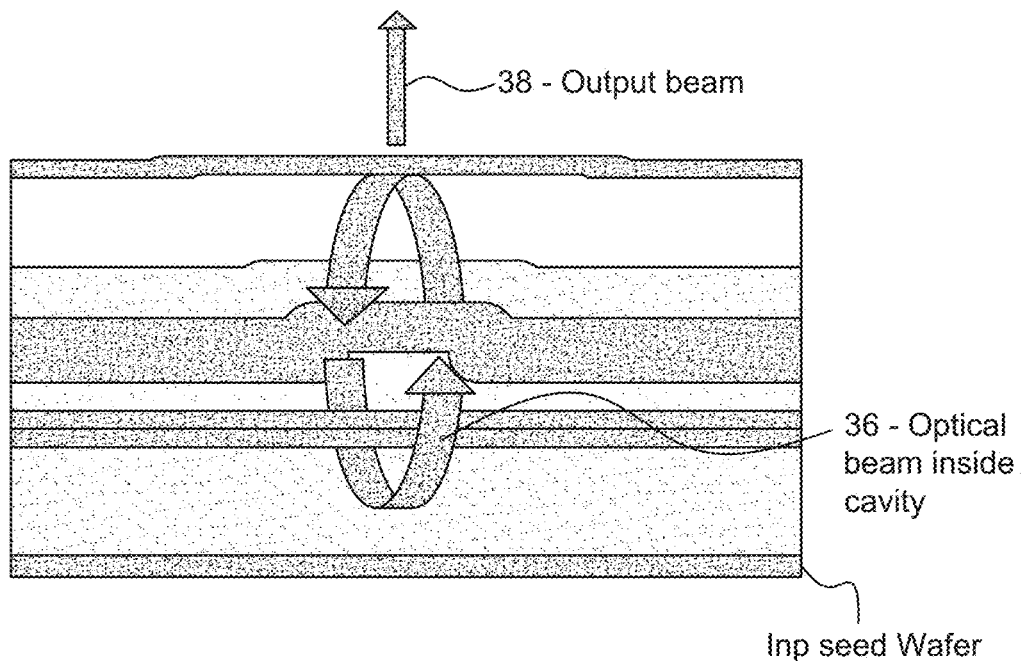
FIG. 5 illustrates an embodiment of FIG. 1A with an output beam and an optical beam inside of a cavity.
Figure 6:
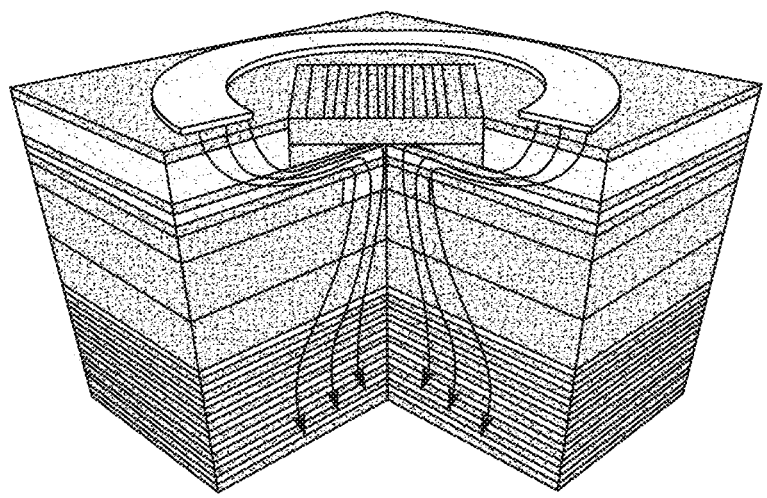
FIG. 6 illustrates one embodiment of electrical current confinement through a BTJ aperture, where electrical current flow from a top to a bottom contact.
Figure 7:
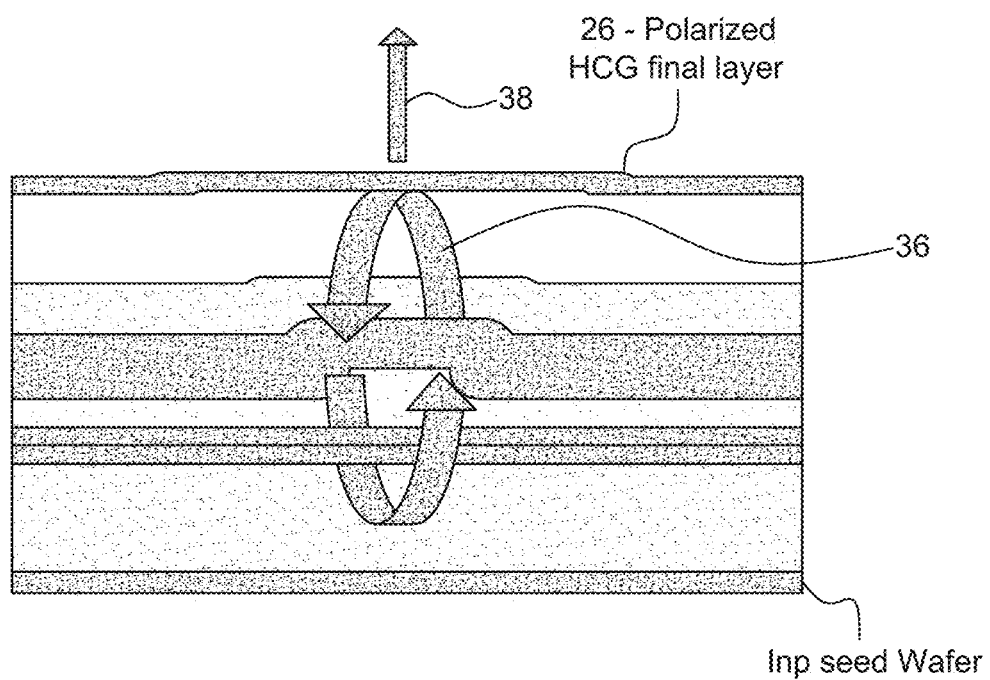
FIG. 7 is similar to FIG. 3, but with a planarized HCG final layer.
Figure 8:
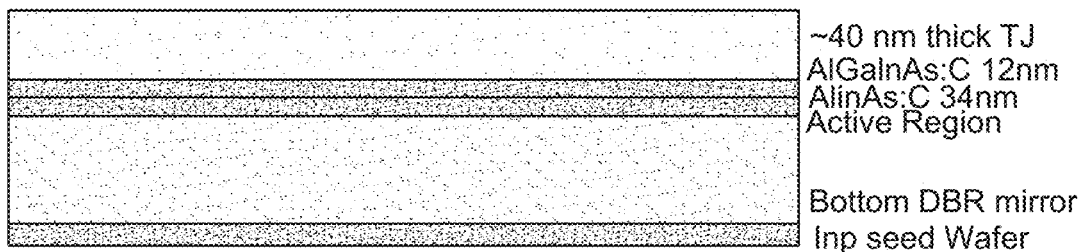
FIG. 8 illustrates one embodiment of a manufacturing sequence with a growth of a bottom, a timed etch of the TJ, leaving some p++, and a regrowth on top of a VCSEL from an etched seed layer.
Figure 9:
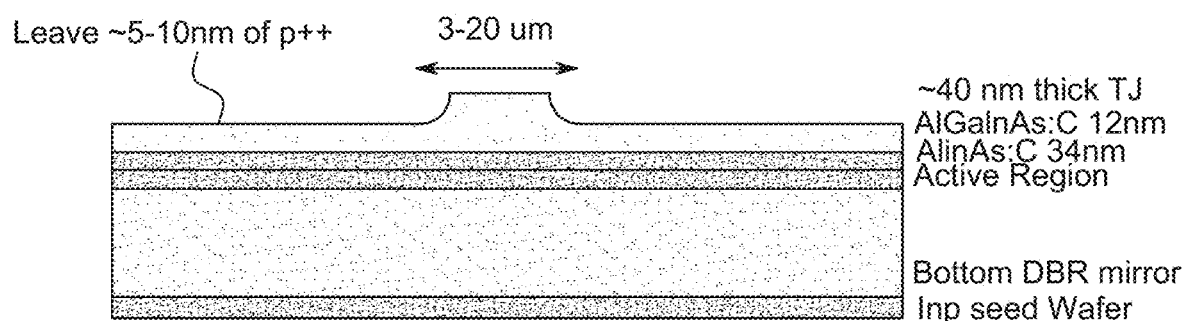
FIG. 9 illustrates one embodiment of a manufacturing sequence with a timed slow etch.
Figure 10:
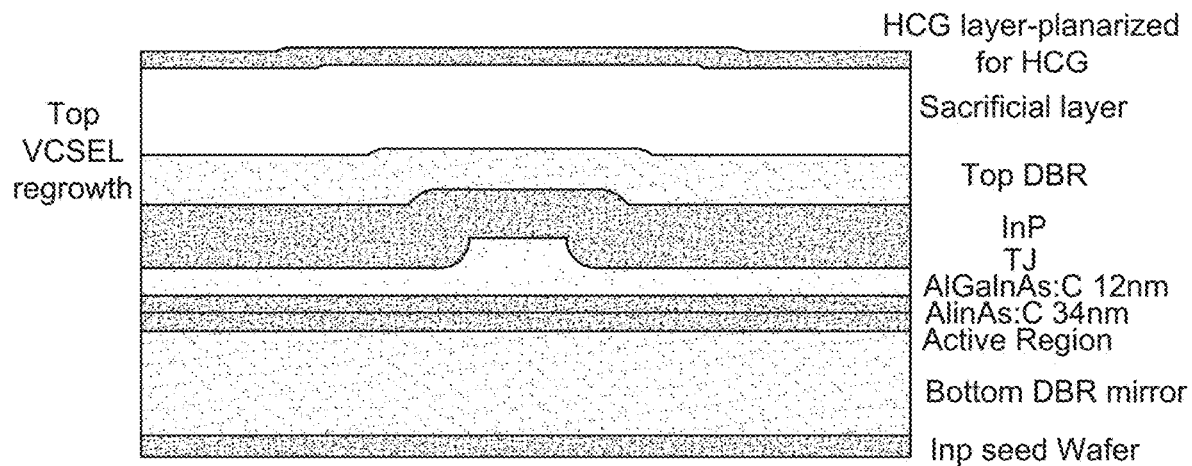
FIG. 10 illustrates one embodiment of a manufacturing sequence with a regrowth of n-InP with grading, and a regrowth of a top DBR, sacrificial layer and HCG layer.

In one embodiment, the HCG 34 conformally covers the selected shape structure 26 layered on the selected shape structure 26. The HCG 34 remains anchored by a variety of different methods including not limited to: a membrane, or membrane structure, by beams after partial removal of sacrificial layer in order to move with respect to the optical resonator and modify a cavity length and consequent wavelength emitted by light emitting structure, and the like. A shape of the output beam 38, as in FIGS. 5 and 6, is determined by a geometric shape of the one or more BTJ apertures 29, and the apertures for additional TJ's 20, planar structures and/or additional BTJ's 28. and a transmission function of the HCG 34. HCG 34 is designed according to a desired optical transmission function for a desired application.

As a non-limiting example, the HCG 34 operates as a second mirror positioned over the vertical resonator cavity 32. As a non-limiting example, the HCG 34 is layered over the sacrificial layer. In one embodiment, a shape of the output beam of light emitting device 10 is determined by a geometric shape of the one or more BTJ apertures 29, and apertures for additional TJ's 20, planar structures and/or additional BTJ's 28.

As a non-limiting example, the far field transmission range is application dependent. As a non-limiting example, the output beam can be a plurality of different geometries including but not limited to circular, elliptical and the like.

The selected shape structure can be created by a variety of ways. As non-limiting examples, the selected shape structure can be created can be made with a grid, a circular array of dots, a screen, hole and screens, and the like.

In one embodiment, the light emitting device 10 is a VCSEL (hereafter referred to as ("VCSEL 10").

Relative to efficiency, the VCSEL 10 can be designed to maximize the light output relative to the desired application. Additionally, the number of BTJ's 28 created can be in response to the application.

In one embodiment, a shape of the output beam 38 is configured from a design of the electrical confinement aperture 30. As a non-limiting example, a geometry of the electrical confinement aperture 30 is slightly asymmetric to provide that the beam 36 inside the VCSEL 10 provides a Gaussian beam shape as the output beam 38 from the HCG 34.

In one embodiment, a coupling loss of the output beam 38 to a fiber or wavelength is reduced when VCSEL output beam 38 is designed to match the fiber modes. As a non-limiting example, the HCG 34 controls one or more of: an output beam 38 polarization, optical beam 3 shape and a single longitudinal wavelength. As a non-limiting example, the HCG 34 is further released from selected shape structure 26 by selective etch of spacing layers 22. In one embodiment, p-doping is on a top of the active region 14 leading to n-doping to a bottom of active region 14.

In one embodiment, at least a portion of the spacing layers 22 above the one or more BTJ apertures 29, the apertures for additional TJ's 20, planar structures and/or addition BTJ's 28, have thicknesses defined as multiples of quarter-wavelength of target lasing wavelength, in one embodiment, spacing layers and the top DBR 42 can have different thickness. As a non-limiting example, the top DBR 42 has a smaller number of layers than the bottom DBR.

Spacing layers 22 can also be used for electrical current spreading, thermal dissipation, or minimizing optical absorption, for example, but not limited to those ends.

In one embodiment, a top DBR 42 is not included in VCSEL 10. The sacrificial layer 44 of semiconductor material is removed via etching at specific locations in order to release the top mirror tuning structure. In one embodiment, the etching of the sacrificial layer 44 uses a wet or dry etch process. The sacrificial layer 44 can remain when the top mirror is not moveable as a non-tunable design and has a low index of refraction compared to a material of the top DBR 42. Successive steps are used in the growth of the VCSEL 10 and can also provide lateral optical confinement due to a graded lens effect. An epitaxial growth and a regrowth of the VCSEL 10 is achieved In one embodiment, HCG 34 is formed of a semiconductor epitaxial layer. HCG 34 is layered on a selected shape structure 26, that can be less than 100 nm. In one embodiment, VCSEL10 produces a stable linearly polarized output defined by HCG 34. In one embodiment of the present invention, VCSEL 10 is created by a process of two independent epitaxial growths. In one embodiment, first and second epitaxial growth structures are characterized, and formed by epitaxial growth.

As a non-limiting example, the first epitaxial growth structure is on a seed substrate 46 of III-V semiconductor material and includes: the bottom mirror Distributed Bragg Reflector (DBR) 26 on a top surface of the seed substrate 46 is defined by alternate layers of high and low index of refraction. Active region, generally denoted as 24, is adjacent to first mirror 12, consisting of quantum wells and barriers 16. A plurality of layers 22 can be optional. The final layer, and the at least one TJ 20, are etched laterally to define an etched electrical confinement aperture 30 through which an electrical current flow. The HCG 34 and spacing layers 22 are formed over in a stepped format (selected shape structure 26). The etched electrical confinement aperture 30 being the one or more BTJs 28 that is a selected shape structure 26, as a result of further regrowth.

As a non-limiting example, the one or more BTJS 28 provide for VCSEL 10 current confinement in a VCSEL 10, and can be implemented for any VCSEL 10 in the SWIR band, from 650 to 1800 nm. More particularly, this can for InP based VCSELs 10 (above 1300 nm).

In one embodiment, for current confinement, the VCSEL 10 of the present invention uses the one or more BTJ's 28, additional TJ's 20, planar structures and/or addition BTJ's 2, instead of ion implant or oxide aperture.

As a non-limiting example, the VCSEL 10 with the one or more BTJ's 28, a BTJ 28 and can provide better current blocking outside of electrical confinement aperture 30 than ion implanted apertures and also provide good reliability.

In one embodiment, of the first epitaxial growth structure, the top surface of the seed substrate 46 is defined by alternate layers of high and low index of refraction.

In one embodiment, of the first epitaxial growth structure, the active region 14 is a source of light vian electrooptic effect due to a recombination of holes and electron. As a non-limiting example, the active region 14 is undoped and surrounded by one or more p-n junctions in order to promote recombination of electrons-holes.

In one embodiment, of the first epitaxial growth structure, at least a portion of the plurality of spacing layers 22 have a varied thicknesses depending on an optical design. In one embodiment, at least a portion of the plurality of spacing layers 22 are adjacent to the active region 14 or to additional spacing layers 22.

In one embodiment of the first epitaxial growth structure, the TJ 20 is a highly doped p++ layer directly on the top of a highly doped n++ layer.

In one embodiment of the first epitaxial growth structure, final layer is made of a same material of the seed substrate 46.

In one embodiment of the first epitaxial growth structure, the final layer is not included, depending on the optical design.

The TJ 20 layer is etched laterally and defines the selected shape structure 26, that is chosen based on the application. This becomes the one or more BTJs 28, a BTJ 28 additional TJ's 20, planar structures and/or addition BTJ's 28.

In one embodiment, a second epitaxial growth structure starts on a top of the first epitaxial growth structure after TJ 20 lateral etch. In one embodiment, the second epitaxial growth structure is a regrowth on top of the first stepped epitaxial growth structure, creating the one or more BTJs 28 from the one or more TJs 20, This becomes the one or more BTJs 28, additional TJ's 20, planar structures and/or addition BTJ's 28.

In one embodiment, the second epitaxial growth structure includes: spacing layers 22; an optional top DBR 42 mirror; a sacrificial layer; a top layer, which supports the top mirror manufacturing; and extra layers for supporting metal contacts.

In one embodiment, the p-doping is on a top of the active region 14 leading to n-doping to the bottom of the active region 14. In one embodiment, this is reversed and the n-doping is on the top of the active region 14, the p-doping is on the bottom.

In one embodiment of the second epitaxial growth structure, the second epitaxial growth structure starts on a top of the previously processed semiconductor stack.

In one embodiment of the second epitaxial growth structure, the second epitaxial growth structure includes spacing layers 22. As a non-limiting example, these spacing layers 22 have a varied thickness depending on the optical design.

In one embodiment of the second epitaxial growth structure, the spacing layers 22 are above the etched TJ 20 aperture. In one embodiment, the etch of the TJ 20 can be etching into the layers below the TJ 20. The TJ 20 and the layers below it can be fully etched, partially etched and the like. As a non-limiting example, the profile of the etch can be based of the selected application, and sidewalls can be created with sidewall angles of 20 to 90 degrees. the sidewalls of the etch can be created based on etching recipe, RF power, the type of chemicals used, crystal dependence, as well the desired end application. In one embodiment of the second epitaxial growth structure, they are added to complete a multiple of quarter-wavelength of a target lasing wavelength. In one embodiment, they have different thickness. In one embodiment, the spacing layers 22 are also used for electrical current spreading, thermal dissipation, or minimizing an optical absorption, and the like.

In one embodiment of the second epitaxial growth structure, the second epitaxial growth structure has a top DBR 42 mirror on top of a seed substrate 46, defined by alternating layers of high and low index of refraction of semiconductor. This top DBR 42 is not mandatory and, as a non-limiting example, has a much smaller number of layers when compared to bottom DBR 26, if it is included in the stack, and optimized based on the application, as well as two beam parameters. In one embodiment, the two beam parameters are reflectivity and the wavelength bandwidth of the mirror.

In one embodiment of the second epitaxial growth structure, the second epitaxial growth structure can be application specific, and include specific spacing sacrificial layer of semiconductor material under top mirror. This can be removed via etching at specific locations in order to release the top mirror tuning structure. In various embodiments, the etching of the sacrificial layer can be achieved with a wet or dry etch process. In one embodiment, this layer can alternatively remain in the structure if the top mirror is not supposed to move (non-tunable design) and has a low index of refraction compared to the top mirror material. In one embodiment, the index of refraction is application and can be as large as possible.

In one embodiment of the second epitaxial growth structure, the top mirror layer is processed during a post regrowth using an etching process and becomes a periodic structure designed to resonate and work as a mirror at specific wavelengths.

In one embodiment, the periodic structure is a high contrast meta structure (HCM) or high contrast grating HCG 34, known as subwavelength grating, or a photonic crystal structure. In one embodiment, the mirror effect requires a lower or a same index of refraction around the periodic structure, which can be air, if released, or other semiconductor or dielectric material, if not released. When it is a tunable structure, the periodic structure is actuated in order to change the optical length of optical cavity vian external input that causes movement of the periodic structure. In one embodiment, an external input is based on thermal, electrostatic or piezoelectric excitation. In one embodiment of the tunable design, tunability can also be achieved by heating the VCSEL 10 or changing its driving current.

In one embodiment of the second epitaxial growth structure, the second epitaxial growth structure extra layers are provided that are designed for supporting metal contacts.

In various embodiment, VCSEL 10 is at least one of: an air-cavity-dominant (ACD) or a semiconductor-cavity-dominant (SCD) design. In one embodiment, the regrowth process is configured to be nearly conformal and increase the lateral dimension of initial BTJ step as defined by the electrical confinement aperture 30 during deposition of epitaxial layers in the second epitaxial regrowth, in one embodiment, the regrowth process decreases a height of this step as more and more layers are added. In one embodiment, at the end, the periodic structure for the first mirror 12 is defined on a selected shape structure 26, which, however, does not have to be necessarily a plane.

As non-limiting examples, the successive steps can provide for lateral optical confinement due to a graded lens effect and improve overall efficiency of VCSEL 10.

In one embodiment, the epitaxial growth and regrowth of the VCSEL 10 can be achieved by conventional III-V epitaxy, such as molecular beam epitaxy (MBE) or metallo-organic chemical vapor deposition (MOCVD) or other techniques including but not limited to LPE, SPE and the like. While MBE can provide better control of each atomic layer, MOCVD can provide a better step coverage.

The HCG 34 can provide strong polarization control since the grating, HCG 34, acts as a polarizer, i.e., only stable linear polarization is transmitted through the grating, HCG 34, In one embodiment, the non-planar structure is formed due to the regrowth process which is started on selected shape structure 26 with TJ 20 delimited by a top of a selected geometric structure, including but not limited to a mesa.

In one embodiment, the one or more BTJ apertures 29 that are created during one or more regrowth's. After regrowth, etched TJ 29 becomes BTJ 20, a buried TJ.

In one embodiment, the HCG 34 is configured to reflect a first portion of light 36 back into the vertical resonator cavity 32. A second portion of light 38 is transmitted as an output beam from the light emitting structure 10. As a non-limiting example, every time the first portion of light 36 is reflected into the vertical resonator cavity 32, portions of light, constituting the second portion of light 38, come out of the light emitting structure 10. As a non-limiting example, the first portion of light 36 bounces around the vertical resonator cavity 36, with a portion coming out as the second portion of light 38.

As a non-limiting example, after sufficient thick regrowth, selected shape structure 26 can become planar, a plane plateau, and the like. It can easier to control processing of the periodic structure. In one embodiment, HCG 34 can be manufactured on a curved of stepwise layer, as far as continuous. In one embodiment, a final dimension of the plane plateau is originated from the epitaxial growth on top of electrical confinement aperture 30 and depends on a thickness of intermediary layers and growth conditions. As a non-limiting example, this thickness can be in the range of 10 μm to 20 μm for a starting electrical confinement aperture 30 with a 3-μm diameter.

In one embodiment, VCSEL 10 is integrated in line detector behind it for FMCW applications, where the reflected light reflects into the VCSEL, causing optical feedback. The detector behind the VCSEL detects power oscillations due to the feedback and the signal can be used to reconstruct the 3D environment.

In one embodiment, a photodetector is at a side of an air gap in s tuning cavity as a detector. As a non-limiting example, the semiconductor, to the side of the air gap in the tunable structure, act as the photodetector and collect scattered light from the HCG and VCSEL body interface due to non-idealities. This offers some advantage to the application in 1) because the photodetector is outside of the cavity and does not contribute any additional feedback, simplifying the signal processing.

In one embodiment, a sensing apparatus includes a VCSEL 10 including one or more active regions 14. Each active region 14 has quantum wells and barriers 16. Active regions 14 are surrounded by one or more p-n junctions, the one or more active regions including a selected shape structure each with a tunnel junction (TJ). One or more apertures are provided with the selected shape structure. One or more buried tunnel junctions (BTJ) 28 or oxide confine aperture, additional TJ's 20, planar structures and/or additional BTJ's 28 are created during a regrowth process that is independent of a first growth process. An output of VCSEL 19 is determined in response to an application of the light emitting device. In one embodiment, bottom DBR 12 can include an HCG and dielectric coating with one or more layers of the dielectric coating.

In one embodiment, the dielectric coating is a stack of high/low index layers As non-limiting examples, the dielectric coating can be a stack of 5-10, 6-10, 7-10, 10 high/low index pairs of dielectric. The dielectric provides a wider tuning range. This provides a broad wavelength mirror. In one embodiment, the top DBR mirror 42 is s a moveable mirror.

With tunable, a specific wavelength is targeted and VCSEL 10 remains at that wavelength. Changing cavity 32 size allows VCSEL 10 to move, and physically change the cavity 32 size for each application In one embodiment, wavelength locking control is provided. This requires an external reference including but not limited to a chip that taps the light. This is then coupled to a reference system. The reference system and the chip are external to the VCSEL In one embodiment, atomic plots are used for the reference system.

As non-limiting examples, ranges of output power can be: one additional active region (or junction) can add ~1× power, and the laser could become 2× more powerful. However, as it also adds extra heat coming from additional optical power inside cavity, efficiency goes down. Thus, by adding more junctions we can have more power but to the price that the laser cannot work continuously anymore. Typical multi-junction VCSELs work on pulsed mode and it's very hard to predict range of output power. As a rule of thumb, we can say that 2 junctions will have 2× more power on pulsed operation, 3 junctions 3×. As one increases the number of junctions, pulses have to become faster and intervals longer.

In one embodiment, the output power is from 1 milliwatt to 5 milliwatts per aperture. In one embodiment, multi junction devices have output powers of 10-20 milliwatts, 12-17 milliwatts, and 15 milliwatts. In one embodiment, the oxide confinement defines aperture 24 for electrical current confinement.

As a non-limiting example, a number of quantum wells can be the same in all junctions, but not necessarily. Individual quantum well design can also be slightly different in order to broaden spectral material gain and increase tuning range.

Method of Vcsel Formation

In one embodiment, a regular VCSEL apparatus 10 includes current injection via the one or more BTJs 28, TJ's 20, planar structures and/or additional BTJ's without ion implantation.

As a non-limiting example, VCSEL apparatus 10 includes one or more BTJ's 28 and is tunable. In one embodiment, formation of the one or more BTJ's 28 TJ's 20, planar structures and/or additional BTJ's, requires an etch of a TJ aperture and regrowth of a top semiconductor epitaxial structure. As a non-limiting example, the process results on a non-flat surface, not suitable for an HCG 34. Moreover, uneven surface and regrowth process causes additional strain which also prevents MEMS manufacturing. In one embodiment, this requires relaxation of epitaxial growth through careful design of regrowth and MEMS actuation on the non-planar surface.

In one embodiment, VCSEL 10 formation includes the steps of:
(i) growing a semiconductor active cavity material consisting of a multi-quantum well layer stack sandwiched between bottom and top spacer regions, the top spacer region terminating with a p-layer and a p++/n++ tunnel junction grown on top of the p-layer, each of the p++- and p-layer presenting a p-type layer;
(ii) etching the active cavity material formed in step (i) to form a top of a selected geometric structure such as a mesa, including at least the upper n++ layer of the tunnel junction emerging from the underlying p-type layer, thereby creating a structured surface of the active cavity material formed by the upper surface of the mesand the upper surface of the p-type layer outside a top of a selected structure such as a mesa;

(iii) applying a wafer fusion between the structured surface of the active cavity material and a substantially planar surface of a n-type semiconductor layer of a first distributed Bragg reflector (DBR) stack, thereby causing deformation of the fused surface around a top of a selected structure such as a mesa, and defining an electrical confinement aperture 30 for electrical current flow therethrough, the electrical confinement aperture 30 including a top of a selected structure such as a mesa, surrounded by an air gap between the deformed fused surfaces and defining an active region 14 of the device;

(iv) forming a second DBR stack on the surface of the active cavity material opposite to the structured surface;

(v) forming ohmic contacts on the VCSEL device structure to enable the electrical current flow through the electrical confinement aperture 30 to the active region 14.

In one embodiment, VCSEL apparatus 10 is made with the following processes: epitaxial growth of VCSEL up to tunnel junction (TJ) layer 20; development of TJ etches; identify etchants compatible to the TJ design 20; and development of regrowth process.

Surface compatibility to regrowth—not all surfaces or all materials are suitable for seeding the regrowth process—there is a trade off in between the best design for the TJ 20 and a design good enough which is suitable for regrowth.

Regrowth has to be carried long enough in order to planarize the surface where HCG 34 is manufactured on one or more of: VCSEL regular processing; growth of bottom VCSEL and then: etch of TJ 20, leaving some p++—target is 5-10 nm and regrowth of top VCSEL from etched seed layer.

Then there is: a regrowth of n-InP with grading; a regrowth of top DBR 42 (if included in design), sacrificial layer and HCG 34; followed by standard VCSEL manufacturing.

Figure 11A:
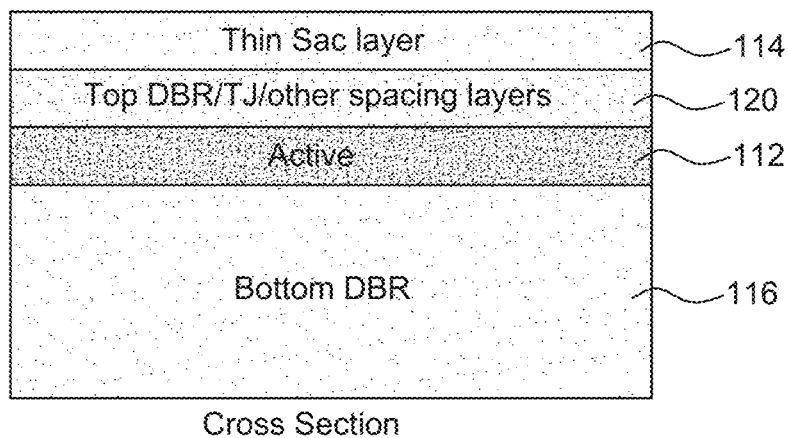
FIGS. 11A and 11B illustrate cross sections and top views of a first growth of the present invention.
Figure 11B:
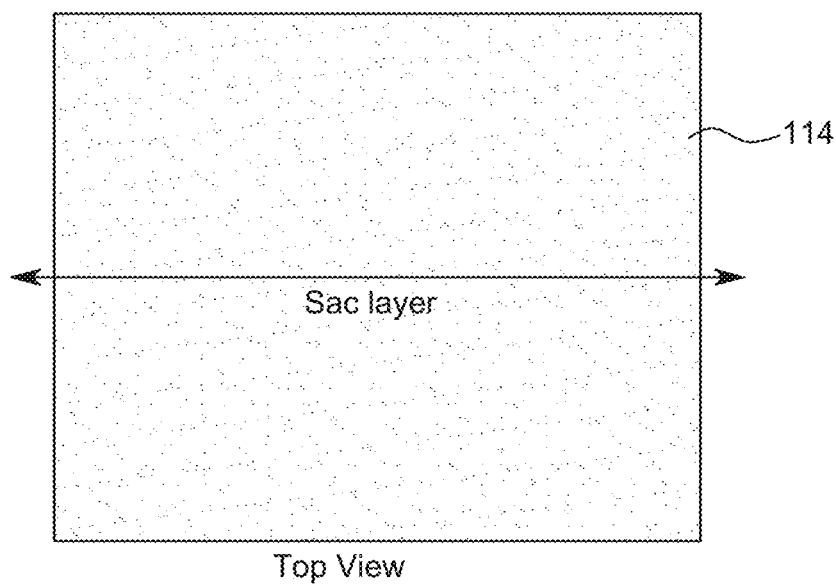

In one embodiment a regular VCSEL 10 epitaxial structure includes an etched post between an active region 112 and a sacrificial layer 114. FIGS. 11A and 11B illustrate a first regrowth including a bottom DBR 116, active layer (region) 112, top DBR 118/other spacing layers 120. The sacrificial layer 114 has a thickness now greater than 100 nm. The optical confinement is defined by the etched post 110 which acts as a waveguide.

In one embodiment, an etched post 110 and regrowth provide lateral current and optical confinement, small volume and increased efficiency for more demanding applications, such as very high-speed modulation and coherent communication. The increased efficiency is achieved because the optical wave and the lateral currents overlap.

Instead of etching the post 110 for confinement in the optical path via mesa etch and regrowth, the optical path is preserved and modify its boundaries for optical confinement. The existence of the sacrificial layer 114 in the present invention favors this new approach as the final interface of regrown material in the optical path is etched away. This preserves optical quality. As a non-limiting example, the manufacturing requires integration and compatibility of several different processes, not required for the conventional semiconductor as-grown DBR.

Figure 12A:
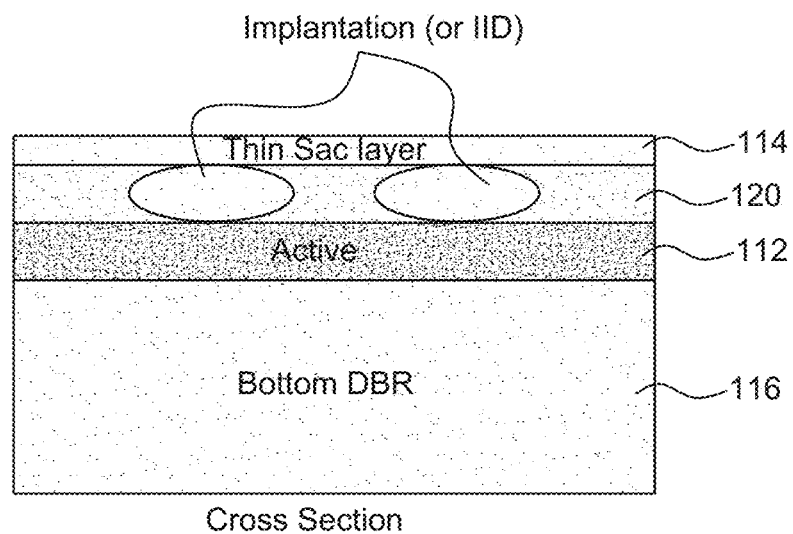
FIGS. 12A and 12B illustrate cross sections and top views of ion implantation of the present invention.
Figure 12B:
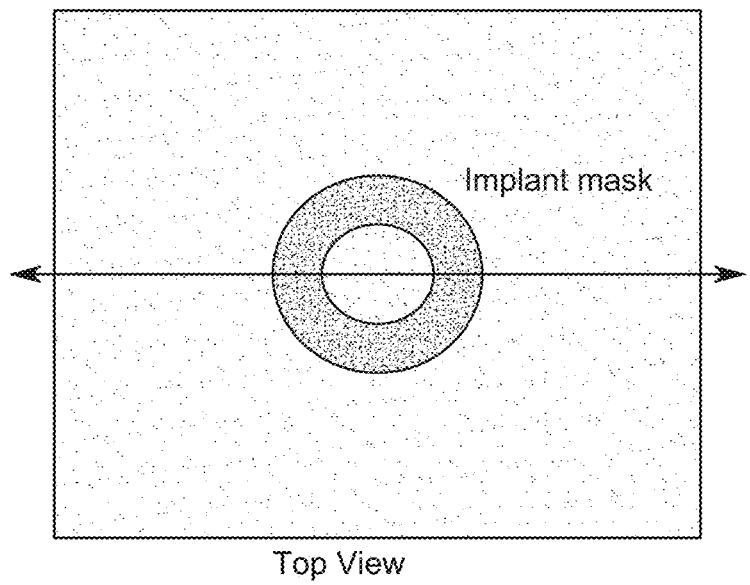

Regrowth of the sacrificial layer 114 around a small mesa 122 step brings much smaller complication when compared to previous approaches of buried heterostructures with steep walls more than 2× taller (3-4 µm) than mesa 122 (0.8 µm). In one embodiment, a full VCSEL is grown up to a thin SAC layer (100 nm of Al0.22Ga0.25In0.53As with 100 nm InP cap). As illustrated in FIGS. 12A and 12B implantation is then proceeded for current confinement under the metal contact pads. In illustrates the etched post 110.

Figure 13A:
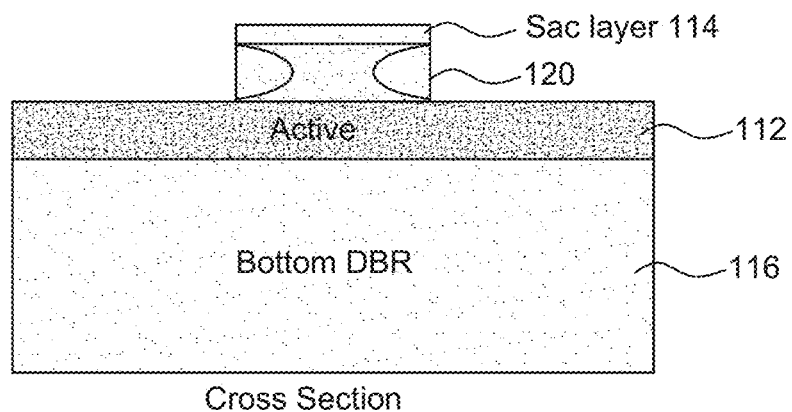
FIGS. 13A and 13B illustrate cross sections and top views of a mesa etch of the present invention.
Figure 13B:
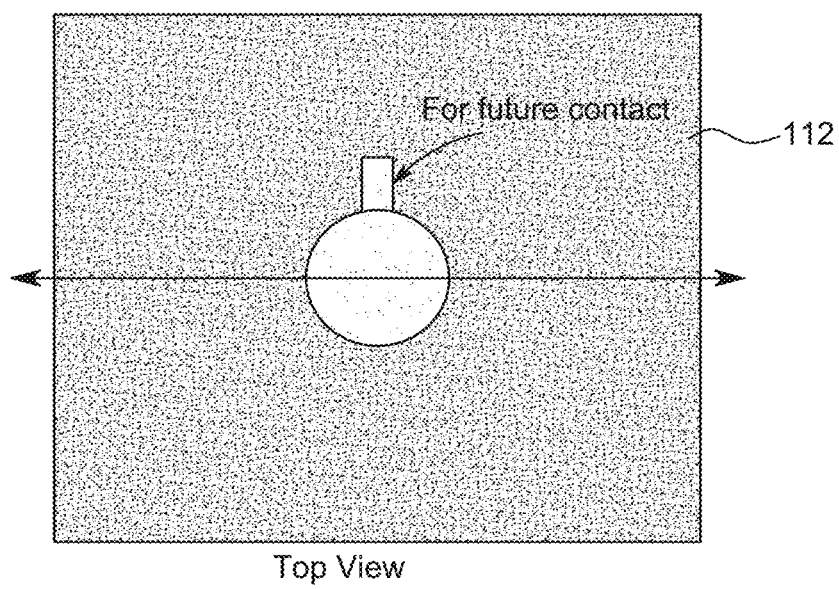
Figure 14A:
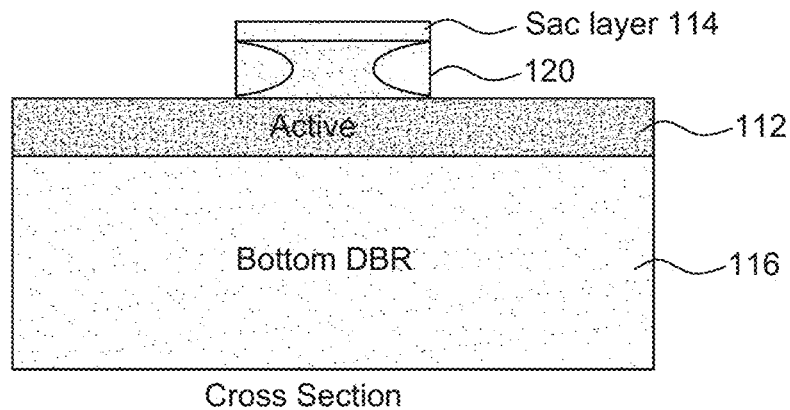
FIGS. 14A and 14B illustrate cross sections and top views of ALD wall protection for further selective etch on release, reliability, of the present invention.
Figure 14B:
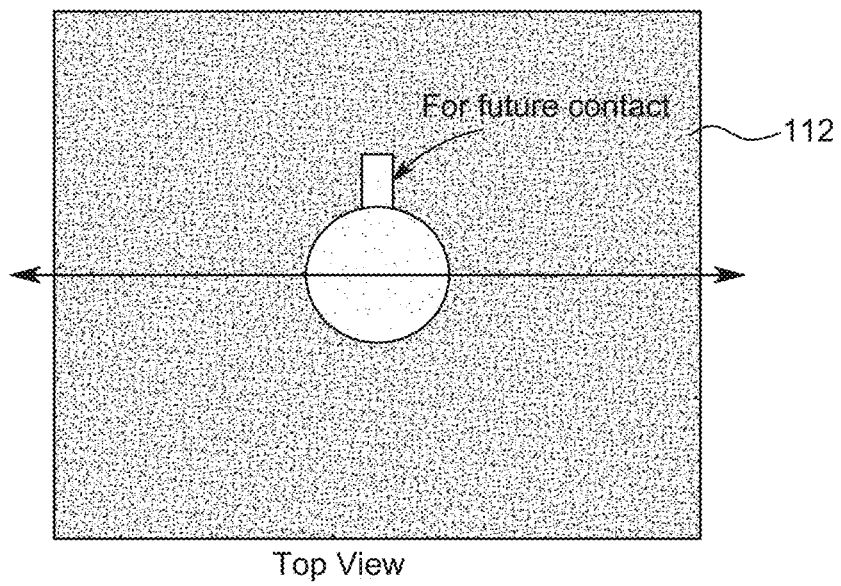

In one embodiment, implantation is done on a structure with the bottom DBR 116, active layer 112 and a thin sacrificial layer 114. The implantation is done on a layer between the active layer 112, and the sacrificial layer 114. An implant mask is used. The structure, including the bottom DBR 116, active layer 112, sacrificial layer 114 and mesa 122 position therebetween, is then dry etch down a very tiny mesa 122 for high-speed (radius of 5-10 µm), up to InP layers, close to a TJ interface FIGS. 13A and 13B. The mesa 122 having an increasing radius up to a top layer. Optical monitoring can be used. Referring to FIGS. 14A and 14B, atomic layer deposition (ALD) is performed only on side walls of etched post 110. This protects the etched post 110 from further release, increased reliability and isolation from surrounding air.

Figure 15A:
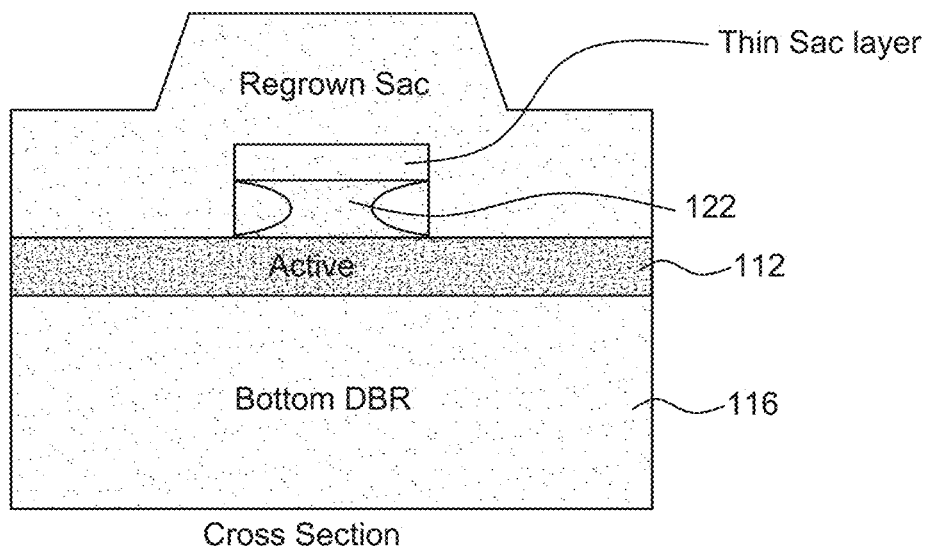
FIGS. 15A and 15B illustrate cross sections and top views of InP growth of the present invention.
Figure 15B:
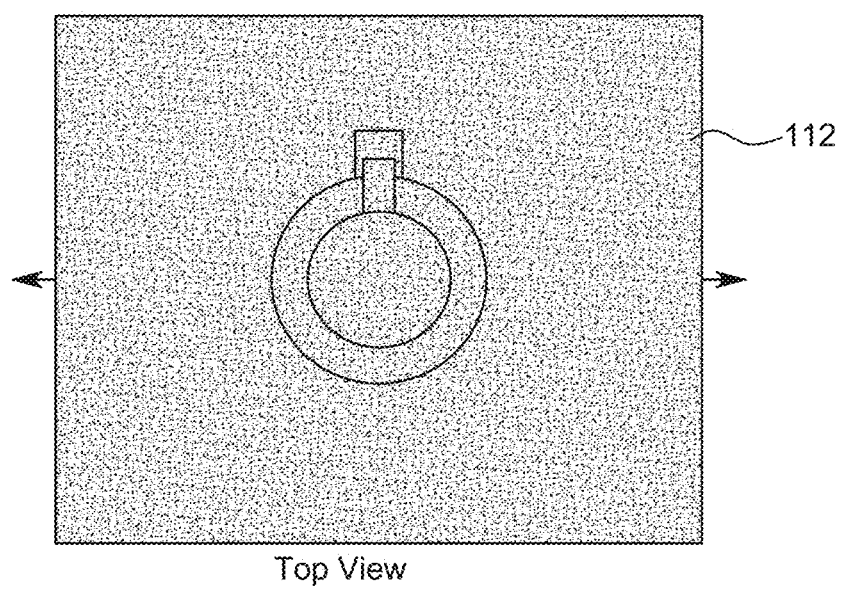

In one embodiment, illustrated in FIGS. 15A and 15B, ALD wall protection is used for further selective etch on release, and for reliability.

Figure 16A:
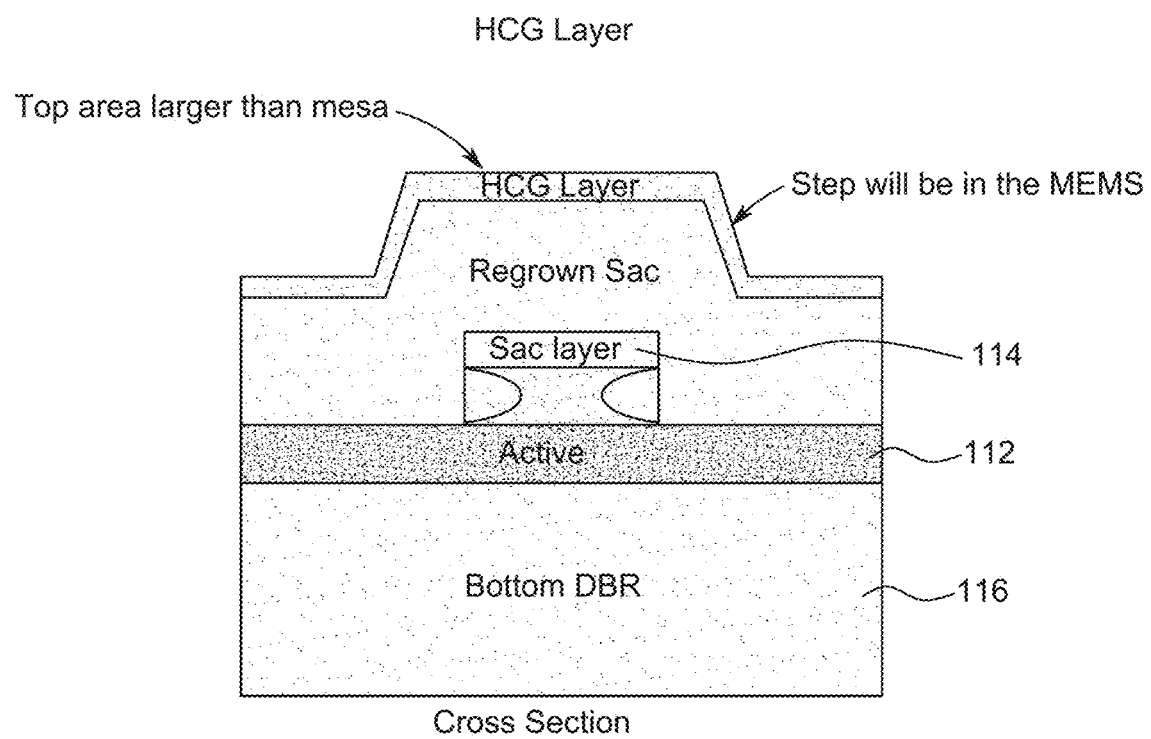
FIGS. 16A and 16B illustrate cross sections and top views of the HCG layer of the present invention.
Figure 16B:
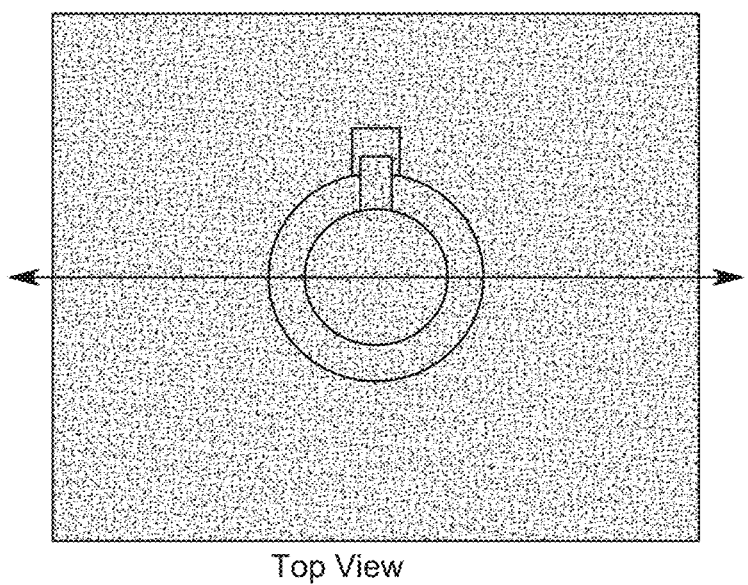

A full regrowth of a full sac layer+HCG on top is performed, as illustrated in FIGS. 16A and 16B, with the interface etched away. InP regrowth is a regrowth around the etched post 110. This is later removed, along with the sacrificial layer 114.

Figure 17A:
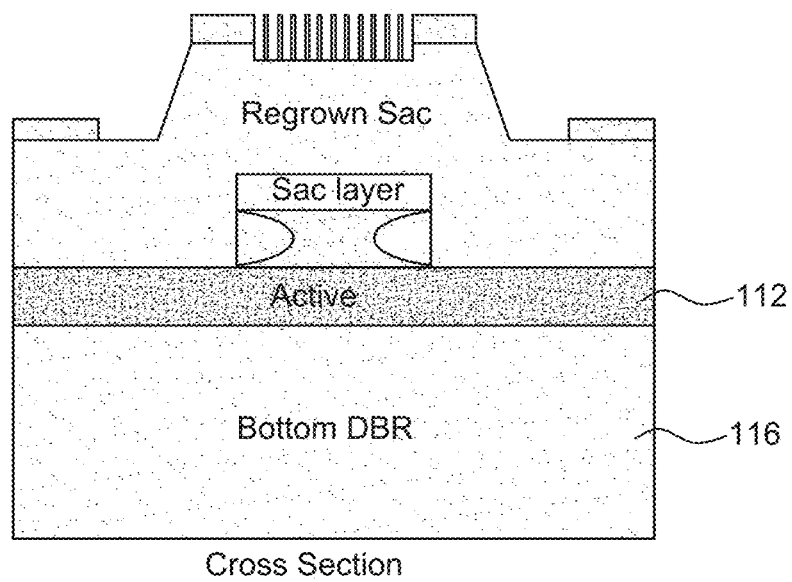
FIGS. 17A and 17B illustrate cross sections and top views of the HCG/MEMS litho/dry Etch of the present invention.
Figure 17B:
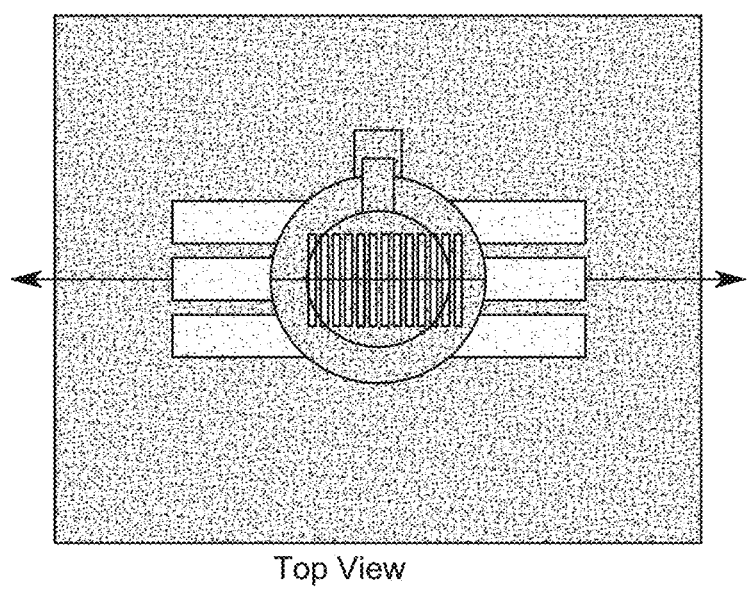

The regrowth interface is out of the optical/current paths. In one embodiment, the regrown layer, the new growing layers cause some defects on the crystal before arriving at the HCG layer. The structure includes the bottom DBR 116, active region (layer) 112, a thin sacrificial layer 114, a mesa 122 therebetween, and a regrowth sacrificial layer 114. In one embodiment, the mesa 122 grows laterally during regrowth for a slightly bigger than mesa 122 HCG, FIGS. 17A and 17B As a non-limiting example, a vertical step on the MEMS beams is not a problem. There is no need for implantation confinement.

Figure 18A:
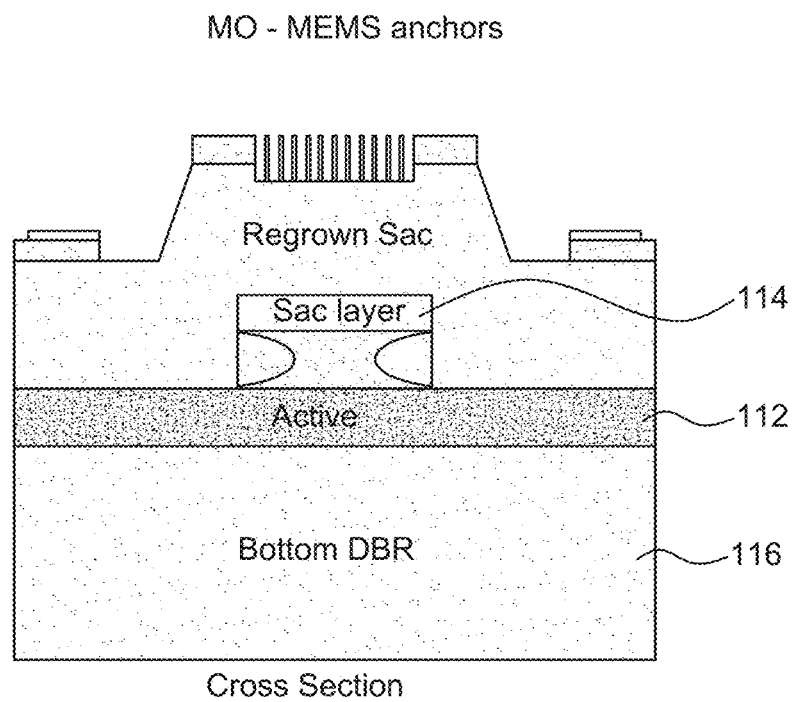
FIGS. 18A and 18B illustrate cross sections and top views of the MO-MEMs anchors, of the present invention.
Figure 18B:
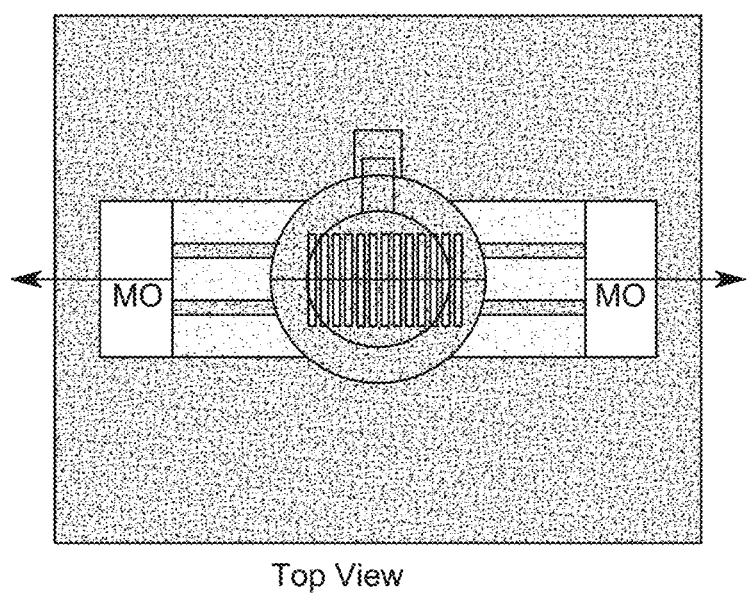
Figure 19A:
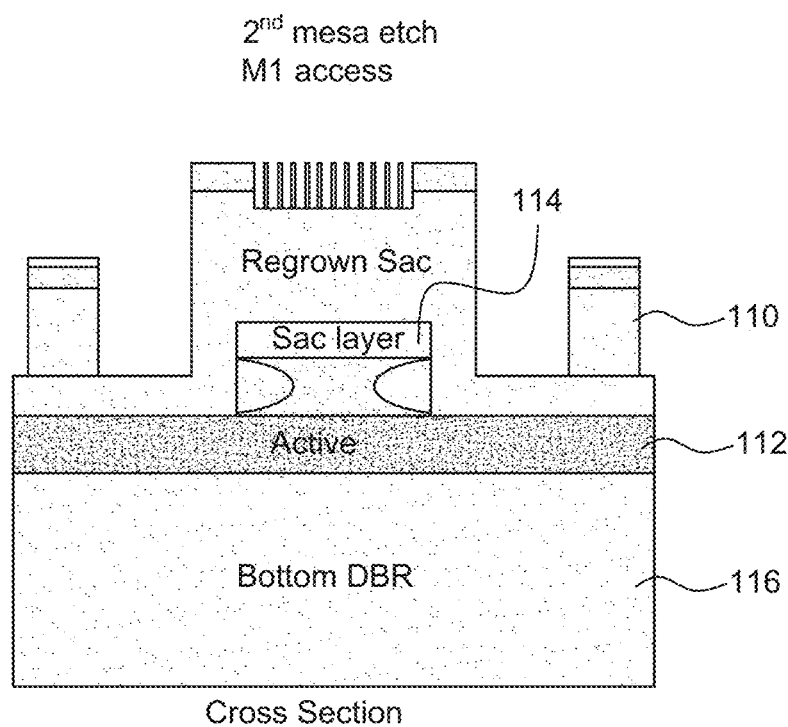
FIGS. 19A and 19B illustrate cross sections and top views of the second mesa etch, M1 access of the present invention.
Figure 19B:
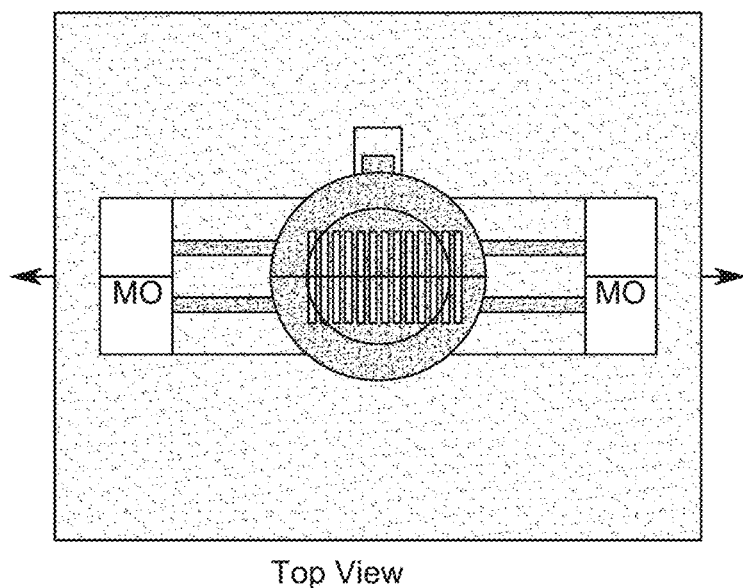
Figure 20A:
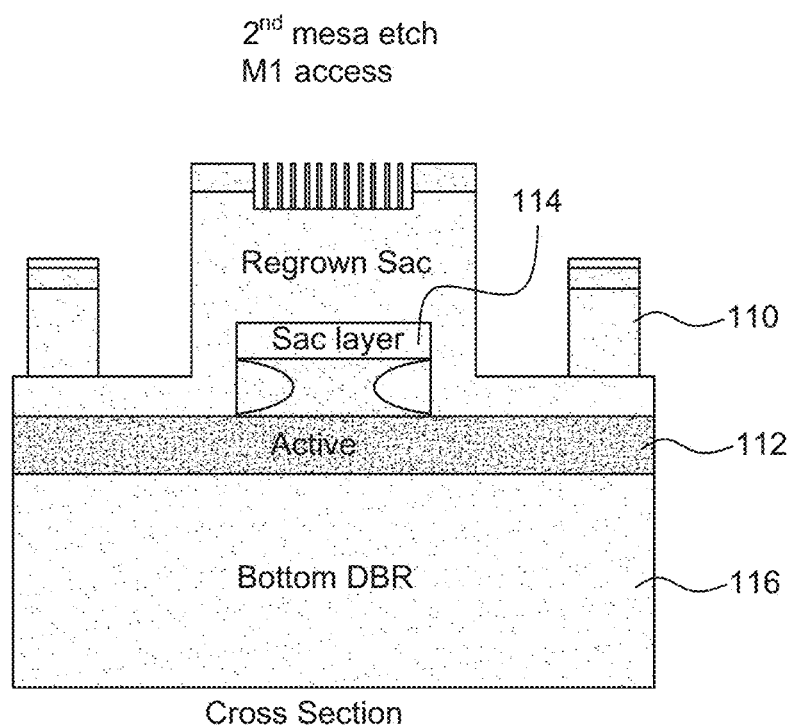
FIGS. 20A and 20B illustrate cross sections and top views of the second mesa etch, M1 deposit, of the present invention.
Figure 20B:
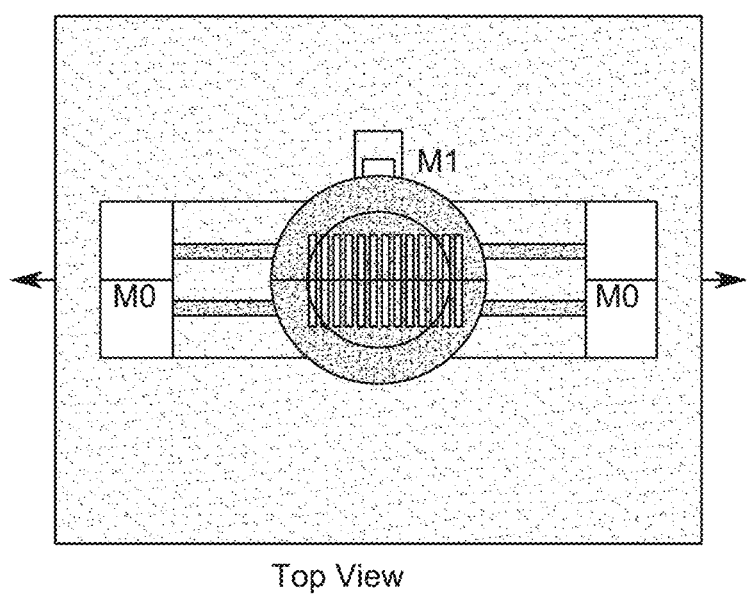

In one embodiment, mesa 122 confinement is provided, e.g, implantation is required only for contact isolation and current injection from the top of the mesa 122. In one embodiment, normal processing is completed for adding contact pads, which as a non-limiting example, the contact pads can be metal 3 and polyimide. MEMS anchors are on either side of the mesa 122, FIGS. 18A and 18B. In one embodiment, a second mesa etch is provides, FIGS. 19A and 19B, following by an M1 cut, FIGS. 20A and 20B.

Figure 21A:
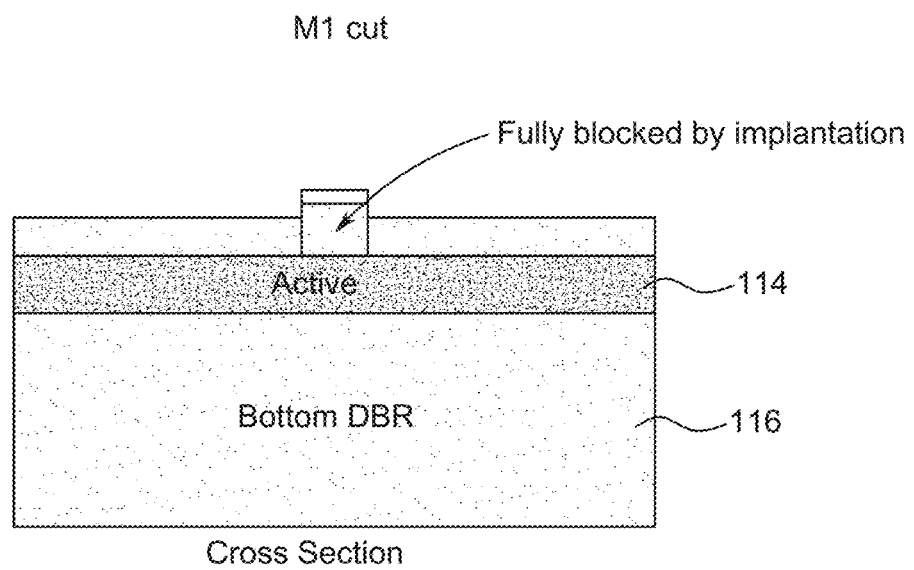
FIGS. 21A and 21B illustrate cross sections and top views of the M1 cut of the present invention.
Figure 21B:
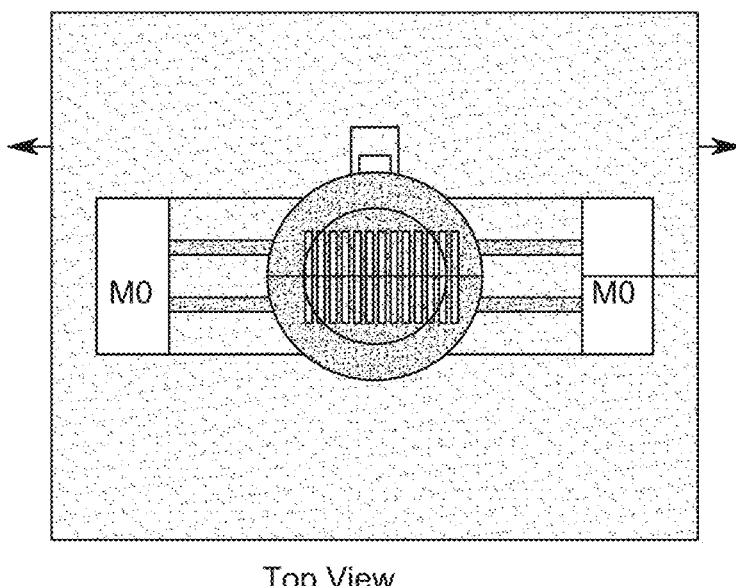
Figure 22A:
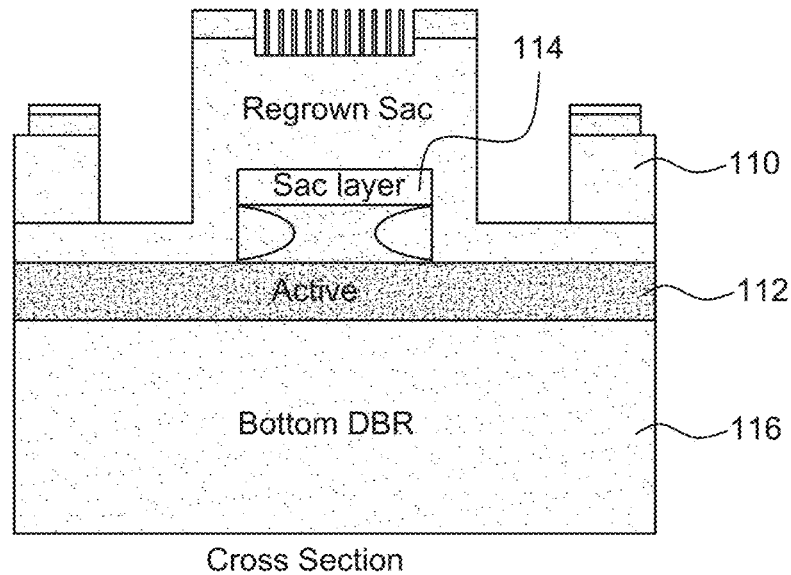
FIGS. 22A and 22B illustrate cross sections and top views of the M1 cut of the present invention.
Figure 22B:
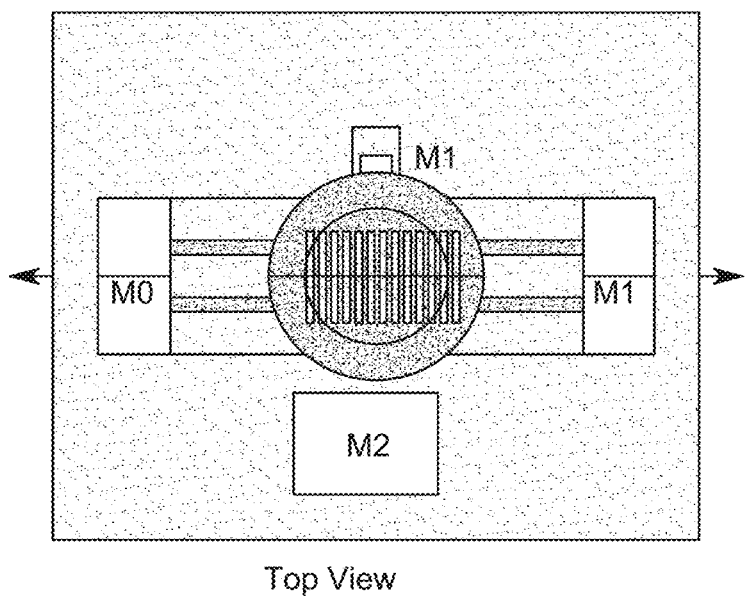

An opened access, M2, to the bottom DBR 116 contact is created, FIGS. 21A and 21B. This is followed by a release, FIGS. 22A and 22B. The release can be at the MEMS beams.

E-beam lithography has some topography on the MEMS beams. The beams can be defined by regular lithography (1-2 µm wide).

Examples

Experimental Data

Tunable HCG VCSEL uses the parameter Vtun (tuning voltage) to control lasing wavelength Vtun—tuning voltage, applied across HCG layer and bottom of sacrificial layer Standard VCSEL parameters are LOP—Laser Output Power Ifwd—VCSEL electrical pumping current Vfwd—VCSEL voltage (voltage across laser)

Detector Current

Itun—measured in between HCG layer and bottom of sacrificial layer (same terminals as Vtun)

Different wavelengths, at different Vtun, have different inclination and threshold current (top graph)

Itun can change inclination and has a kink at laser threshold for each different wavelength (bottom graph)

for Ifwd≤1mA, there is no lasing and Itun×Vtun is approximately linear for Ifwd>1mA, VCSEL starts lasing and Itun follows laser power Above graphs show that VCSEL is not lasing at all different Vtun. In other words, VCSEL is only lasing within a defined spectral range. For example, at Ifwd=4 mA (dark blue) VCSEL starts lasing at Vtun=7 mA and stops lasing above Vtun=15V. Note that Itun×Vtun is linear below 7V and above 15V.

note that for Ifwd=0 mA, I tun is ~100× smaller than in a case where there is only spontaneous emission and VCSEL is not lasing yet (e.g., at Ifwd=0.5 mA)

VCSEL is lasing only in the spectral range equivalent to 7V<Vtun<15V

Figure 23:
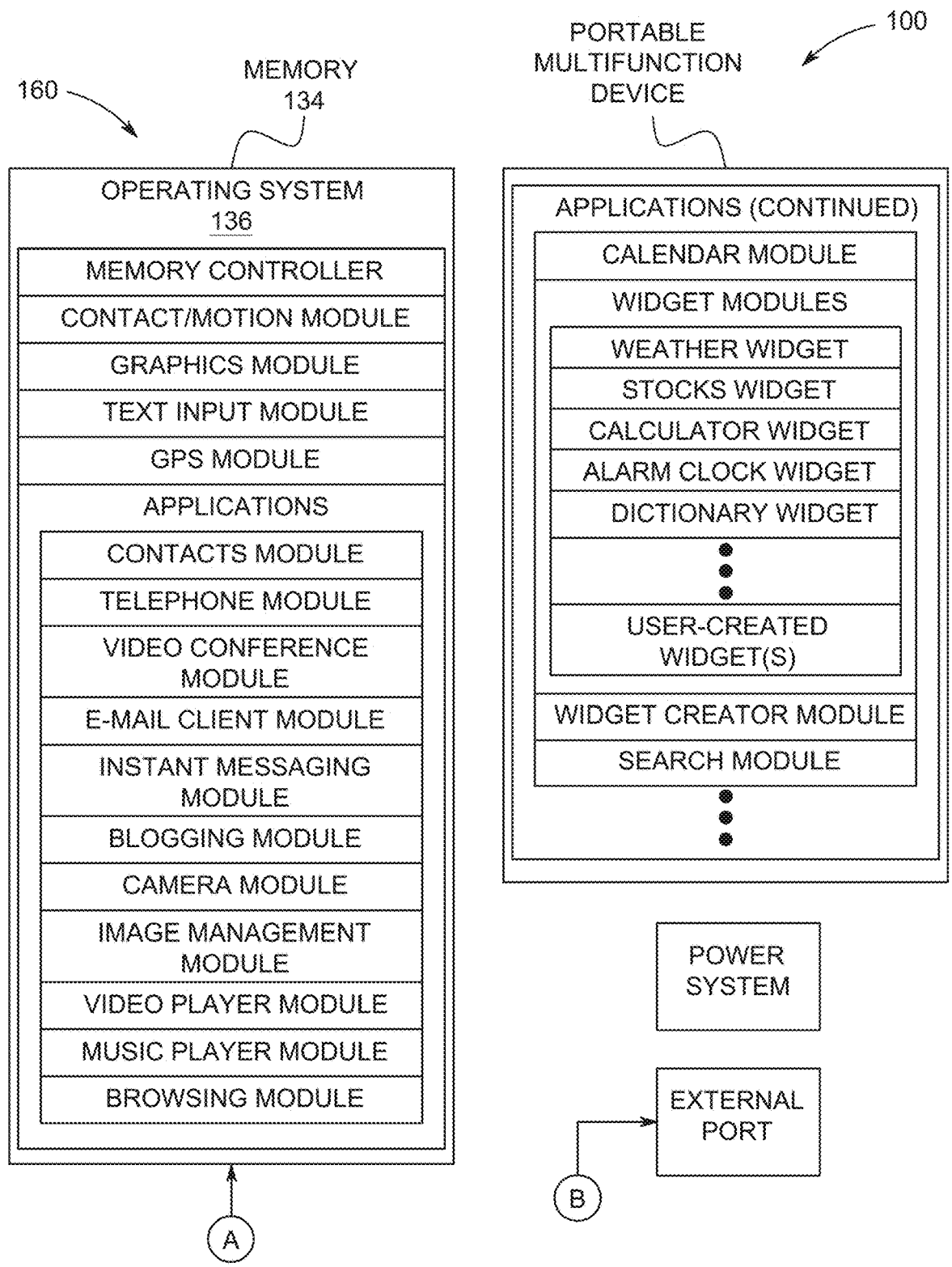
FIG. 23 illustrates one embodiment of a mobile device and/or computing device that can be used with the present invention.
Figure 24:
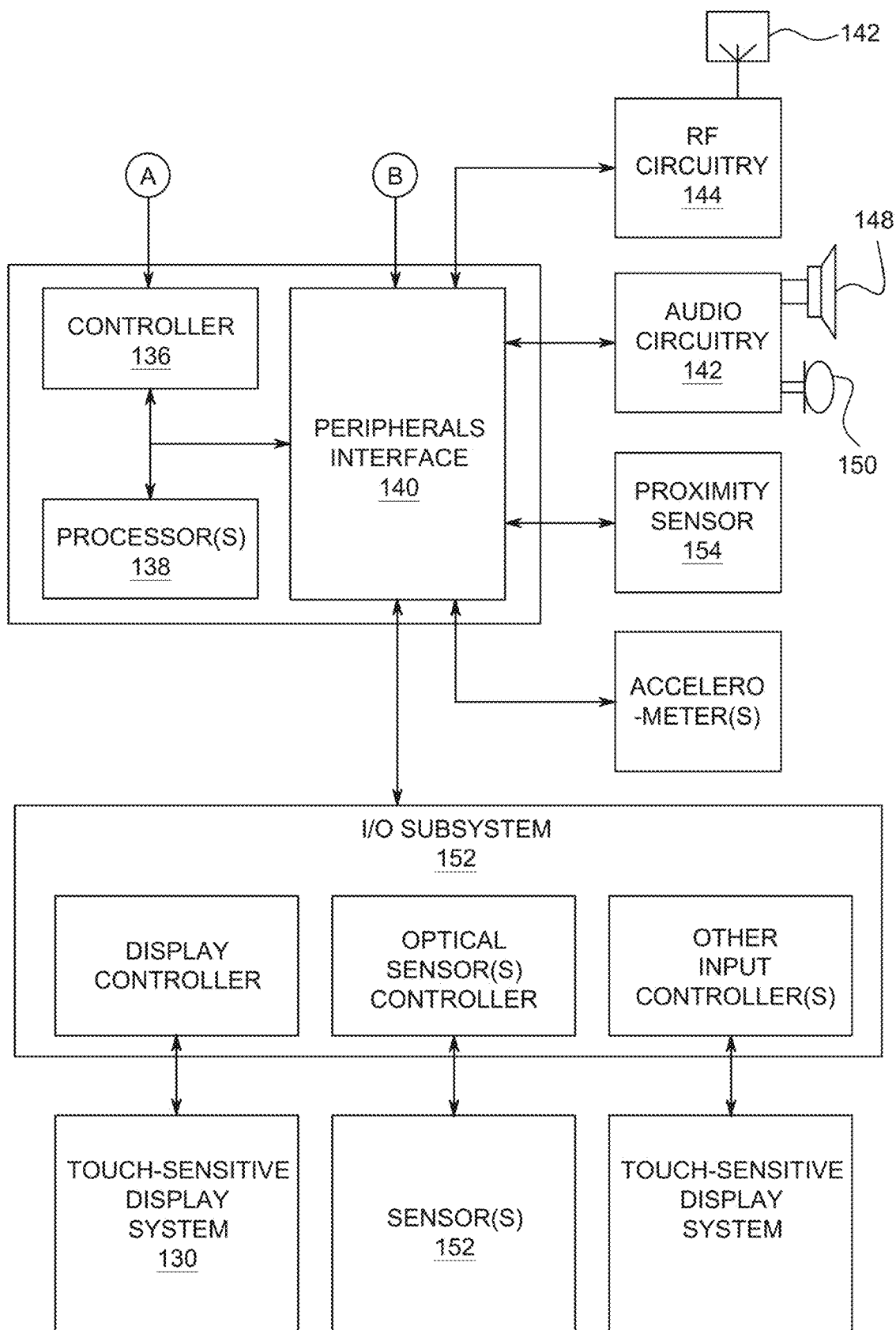
FIG. 24 illustrates one embodiment of an operating environment of a computer system for providing CGR experiences in one embodiment of the present invention.
Figure 25:
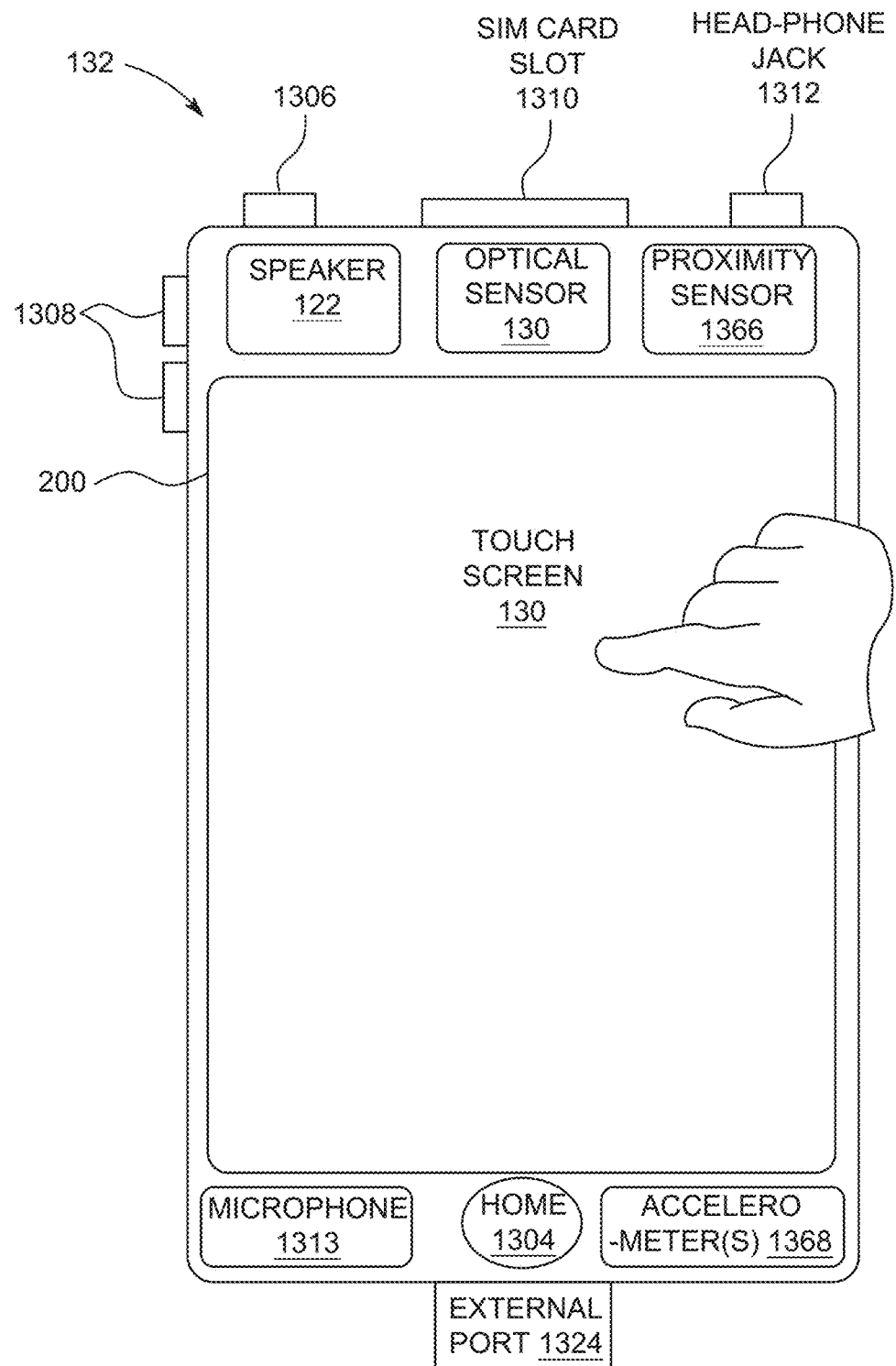
FIG. 25 illustrates one embodiment of a mobile device and/or computing device that can be used with the present invention.

As illustrated in FIGS. 23-25, the mobile or computing device 100 can include a display 130 that can be a touch sensitive display. The touch-sensitive display (screen) 130 is sometimes called a "touch screen" for convenience, and may also be known as or called a touch-sensitive display system 132. The mobile or computing device 100 may include a memory (which may include one or more computer readable storage mediums), a memory controller 136 one or more processing units (CPU's) 138, a peripherals interface 140, Network Systems circuitry 142, including but not limited to RF circuitry 144, audio circuitry 146, a speaker 148, a microphone 150, an input/output (I/O) subsystem 152 (including a display controller, optical sensor controller and other input controllers), other input or control devices, and an external port. The mobile or computing device 100 may include one or more optical sensors 152. These components may communicate over one or more communication buses or signal lines.

It should be appreciated that the mobile or computing device 100 is only one example of a portable multifunction mobile or computing device 100, and that the mobile or computing device 100 may have more or fewer components than shown, may combine two or more components, or a may have a different configuration or arrangement of the components. The various components may be implemented in hardware, software or a combination of hardware and software, including one or more signal processing and/or application specific integrated circuits.

Memory 134 may include high-speed random access memory and may also include non-volatile memory, such as one or more magnetic disk storage devices, flash memory devices, or other non-volatile solid-state memory devices. Access to memory by other components of the mobile or computing device 100, such as the CPU 140 and the peripherals interface 118, may be controlled by the memory controller 154.

The peripherals interface 118 couples the input and output peripherals of the device to the CPU 138 and memory 134. The one or more processors 138 run or execute various software programs and/or sets of instructions stored in memory to perform various functions for the mobile or computing device 100 and to process data.

In some embodiments, the peripherals interface 140, CPU 138, and memory controller 136 may be implemented on a single chip. In some other embodiments, they may be implemented on separate chips.

The Network System circuitry 142 receives and sends signals, including but not limited to RF, also called electromagnetic signals. The Network System circuitry 142 converts electrical signals to/from electromagnetic signals and communicates with communications Network Systems 142 and other communications devices via the electromagnetic signals. The Network Systems circuitry 142 may include well-known circuitry for performing these functions, including but not limited to an antenna system, an RF transceiver, one or more amplifiers, a tuner, one or more oscillators, a digital signal processor, a CODEC chipset, a subscriber identity module (SIM) card, memory, and so forth. The Network Systems circuitry 142 may communicate with Network Systems and other devices by wireless communication.

The wireless communication may use any of a plurality of communications standards, protocols and technologies, including but not limited to Global System for Mobile Communications (GSM), Enhanced Data GSM Environment (EDGE), high-speed downlink packet access (HSDPA), wideband code division multiple access (W-CDMA), code division multiple access (CDMA), time division multiple access (TDMA), BLUETOOTH®, Wireless Fidelity (Wi-Fi) (e.g., IEEE 802.11a, IEEE 802.11b, IEEE 802.11g and/or IEEE 802.11n), voice over Internet Protocol (VOIP), Wi-MAX, a protocol for email (e.g., Internet message access protocol (IMAP) and/or post office protocol (POP)), instant messaging (e.g., extensible messaging and presence protocol (XMPP), Session Initiation Protocol for Instant Messaging and Presence Leveraging Extensions (SIMPLE), and/or Instant Messaging and Presence Service (IMPS)), and/or Short Message Service (SMS)), or any other suitable communication protocol, including communication protocols not yet developed as of the filing date of this document. The audio circuitry 146 receives audio data from the peripherals interface 140, converts the audio data to an electrical signal, and transmits the electrical signal to the speaker 148. The speaker 148 converts the electrical signal to human-audible sound waves. The audio circuitry 144 also receives electrical signals converted by the microphone 124 from sound waves. The audio circuitry 144 converts the electrical signal to audio data and transmits the audio data to the peripherals interface 140 for processing. Audio data may be retrieved from and/or transmitted to memory 134 and/or the Network Systems circuitry 142 by the peripherals interface 140. In some embodiments, the audio circuitry 144 also includes a headset jack. The headset jack provides an interface between the audio circuitry 144 and removable audio input/output peripherals, such as output-only headphones or a headset with both output (e.g., a headphone for one or both ears) and input (e.g., a microphone).

The I/O system 152 couples input/output peripherals on the mobile or computing device 100, such as the touch screen and other input/control devices, to the peripherals interface. The I/O subsystem 152 may include a display controller and one or more input controllers for other input or control devices. The one or more input controllers receive/send electrical signals from/to other input or control devices. The other input/control devices may include physical buttons (e.g., push buttons, rocker buttons, etc.), dials, slider switches, and joysticks, click wheels, and so forth. In some alternate embodiments, input controller(s) may be coupled to any (or none) of the following: a keyboard, infrared port, USB port, and a pointer device such as a mouse. The one or more buttons may include an up/down button for volume control of the speaker and/or the microphone. The one or more buttons may include a push button. A quick press of the push button may disengage a lock of the touch screen or begin a process that uses gestures on the touch screen to unlock the device. A longer press of the push button may turn power to the mobile or computing device 100 on or off. The user may be able to customize a functionality of one or more of the buttons. The touch screen is used to implement virtual or soft buttons and one or more soft keyboards.

The touch sensitive display 130 provides an input interface and an output interface between the device 100 and a user. The display controller receives and/or sends electrical signals from/to the touch sensitive display 102. The touch sensitive display 130 displays visual output to the user. The visual output may include graphics, text, icons, video, and any combination thereof (collectively termed "graphics"). In some embodiments, some or all of the visual output may correspond to user-interface objects, further details of which are described below.

Display 130 can have a screen that uses LCD (liquid crystal display) technology, or LPD (light emitting polymer display) technology, although other display technologies may be used in other embodiments. The touch screen and the display controller may detect contact and any movement or breaking thereof using any of a plurality of touch sensing technologies now known or later developed, including but not limited to capacitive, resistive, infrared, and surface acoustic wave technologies, as well as other proximity sensor arrays or other elements for determining one or more points of contact with display 130.

In one embodiment an optical sensor 130 is coupled to a controller in I/O system 126. The optical sensor 152 may include charge-coupled device (CCD) or complementary metal-oxide semiconductor (CMOS) phototransistors. The optical sensor 152 receives light from the environment, projected through one or more lens, and converts the light to data representing an image. In conjunction with an imaging module (also called a camera module); the optical sensor may capture still images or video. In some embodiments, an optical sensor is located on the back of the mobile or computing device 100, opposite the touch screen display on the front of the device, so that the touch screen display may be used as a viewfinder for either still and/or video image acquisition. In some embodiments, an optical sensor is located on the front of the device so that the user's image may be obtained for videoconferencing while the user views the other video conference participants on the touch screen display. In some embodiments, the position of the optical sensor can be changed by the user (e.g., by rotating the lens and the sensor in the device housing) so that a single optical sensor may be used along with the touch screen display for both video conferencing and still and/or video image acquisition.

The mobile or computing device 100 may also include one or more proximity sensors 154. In one embodiment, the proximity sensor is coupled to the peripherals interface. Alternately, the proximity sensor may be coupled to an input controller in the I/O subsystem. In some embodiments, the proximity sensor turns off and disables the touch screen when the multifunction device is placed near the user's ear (e.g., when the user is making a phone call). In some embodiments, the proximity sensor keeps the screen off when the device is in the user's pocket, purse, or other dark area to prevent unnecessary battery drainage when the device is a locked state.

In some embodiments, the software components stored in memory may include an operating system, a communication module (or set of instructions), a contact/motion module (or set of instructions), a graphics module (or set of instructions), a text input module (or set of instructions), a Global Positioning System (GPS) module (or set of instructions), and applications (or set of instructions).

The operating system includes various software components and/or drivers for controlling and managing general system tasks (e.g, memory management, storage device control, power management, etc) and facilitates communication between various hardware and software components.

The communication module facilitates communication with other devices over one or more external ports and also includes various software components for handling data received by the Network Systems circuitry 142 and/or the external port. The external port (e.g., Universal Serial Bus (USB), FIREWIRE, etc.) is adapted for coupling directly to other devices or indirectly over Network System. In some embodiments, the external port is a multi-pin (e.g., 30-pin) connector that is the same as, or similar to and/or compatible with the 30-pin connector used on iPod (trademark of Apple Computer, Inc.) devices.

The contact/motion module may detect contact with the touch screen (in conjunction with the display controller) and other touch sensitive devices (e.g., a touchpad or physical click wheel). The contact/motion module includes various software components for performing various operations related to detection of contact, such as determining if contact has occurred, determining if there is movement of the contact and tracking the movement across the touch screen, and determining if the contact has been broken (i.e., if the contact has ceased). Determining movement of the point of contact may include determining speed (magnitude), velocity (magnitude and direction), and/or an acceleration (a change in magnitude and/or direction) of the point of contact. These operations may be applied to single contacts (e.g., one finger contacts) or to multiple simultaneous contacts (e.g., "multitouch"/multiple finger contacts). In some embodiments, the contact/motion module and the display controller also detect contact on a touchpad. In some embodiments, the contact/motion MODULE and the controller detects contact on a click wheel.

Examples of other applications that may be stored in memory include other word processing applications, JAVA-enabled applications, encryption, digital rights management, voice recognition, and voice replication.

In conjunction with touch screen, display controller, contact module, graphics module, and text input module, a contacts module may be used to manage an address.

Figure 26:
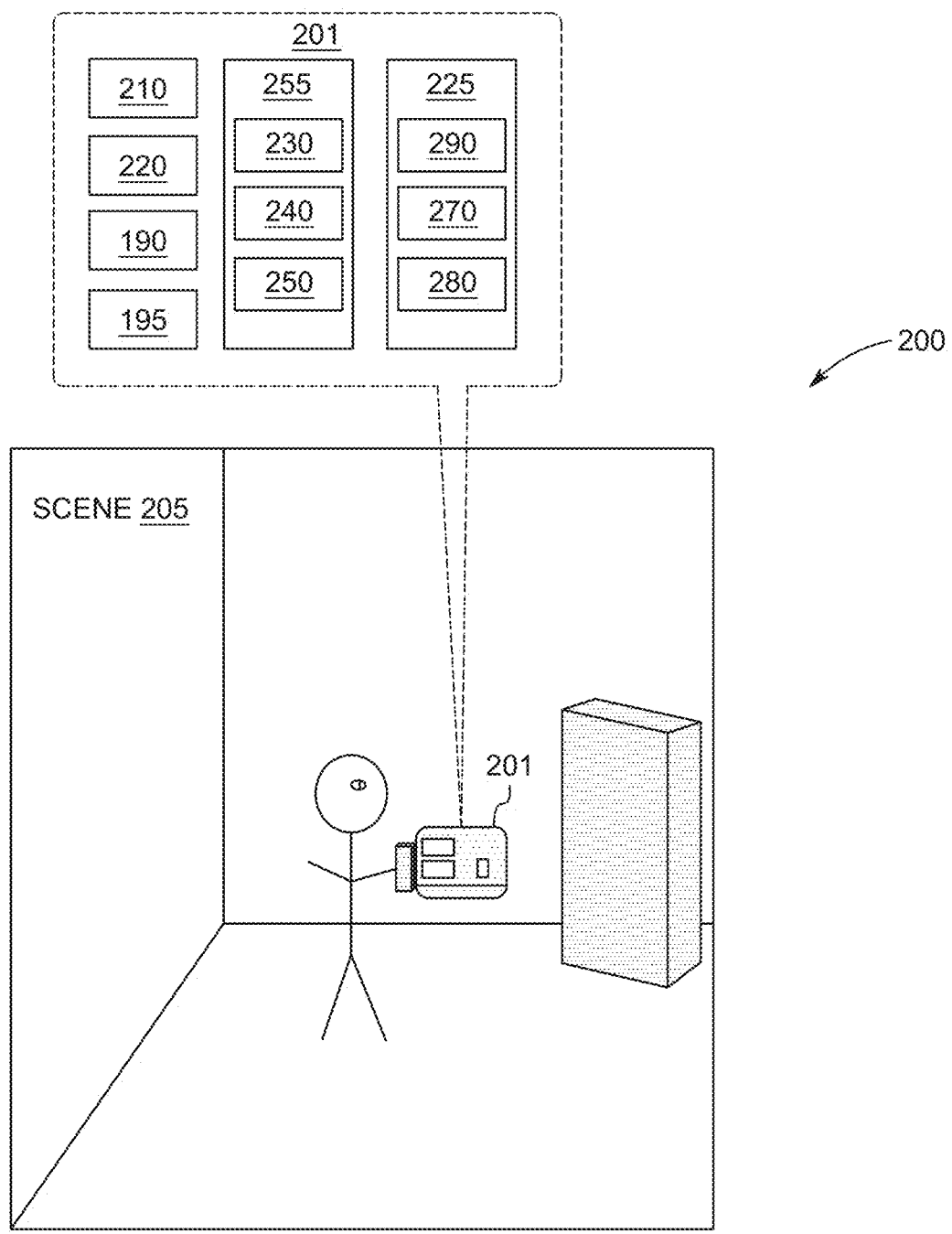
FIG. 26 illustrates one embodiment of the present invention with a controller of a computer system that is configured to manage and coordinate a CGR experience for the user.

As illustrated in FIG. 26, a CGR experience is provided to the user vian operating environment 200 that includes a computer system 201. The computer system 201 includes a controller 210 (e.g., processors of a portable electronic device or a remote server), a display generation component 220 (e.g., a head-mounted device (HMD), a display, a projector, a touch-screen, and the like), one or more input devices 225 (e.g., an eye tracking device 230, a hand tracking device 240, other input devices 250), one or more output devices 255 (e.g., speakers 260, tactile output generators 270, and other output devices 280), one or more sensors 290 (e.g., image sensors, light sensors, depth sensors, tactile sensors, orientation sensors, proximity sensors, temperature sensors, location sensors, motion sensors, velocity sensors, etc.), and optionally one or more peripheral devices 295 (e.g., home appliances, wearable devices, etc.). In some embodiments, one or more of the input devices 225, output devices 255, sensors 290, and peripheral devices 295 are integrated with the display generation component 220 (e.g., in a head-mounted device or a handheld device).

In various embodiments, the CGR experience includes environments in which the user can sense and/or with which a user interacts (e.g., with inputs detected by a computer system 201 generating the CGR experience that cause the computer system generating the CGR experience to generate audio, visual, and/or tactile feedback corresponding to various inputs provided to the computer system 201). These include but are not limited to: physical environment; computer-generated reality, virtual reality, mixed reality, augmented reality, augmented virtuality; and the like.

As a non-limiting example, hardware can include but is not limited to: electronic systems that enable a person to sense and/or interact with various CGR environments; projection-based systems with retinal projection technology that projects graphical images onto a person's retina; and the like. In one embodiment, projection systems are configured to project virtual objects into the physical environment, for example, as a hologram or on a physical surface. As non-limiting examples, controller 210 is configured to manage and coordinate a CGR experience for the user. In some embodiments, the controller 210 includes a suitable combination of software, firmware, and/or hardware.

As a non-limiting example, controller 210 is a computing device that is local or remote relative to the scene 205 (e.g., a physical setting/environment). In one embodiment, controller 210 is a local server located within the scene 205. In one embodiment, controller 210 is a remote server located outside of the scene 205 (e.g., a cloud server, central server, etc.). As a non-limiting example, controller 210 is communicatively coupled with the display generation component 220 via one or more wired or wireless communication channels 244. In one embodiment, controller 210 is included within the enclosure (e.g., a physical housing) of the display generation component 220, one or more of the input devices 225, one or more of the output devices 255, one or more of the sensors 290, and/or one or more of the peripheral devices 295, or share the same physical enclosure or support structure with one or more of the above.

In one embodiment, display generation component 220 is configured to provide the CGR experience (e.g., at least a visual component of the CGR experience) to the user. As a non-limiting example, display generation component 220 includes a suitable combination of software, firmware, and/or hardware.

In one embodiment, display generation component 220 provides a CGR experience to the user while the user is virtually and/or physically present within the scene 205.

In some embodiments, the display generation component is worn on a part of the user's body (e.g., on his/her head, on his/her hand, etc.). In this embodiment, generation component 220 includes one or more CGR displays provided to display the CGR content. Display generation component 220 can enclose the field-of-view of the user. In some embodiments, the display generation component 220 is mobile device 100 configured to present CGR content, and the user holds the mobile device 100 with a display directed towards the field-of-view of the user and a camera directed towards the scene 205. In some embodiments, mobile device 100 is placed within an enclosure that is worn on the head of the user.

Figure 27:
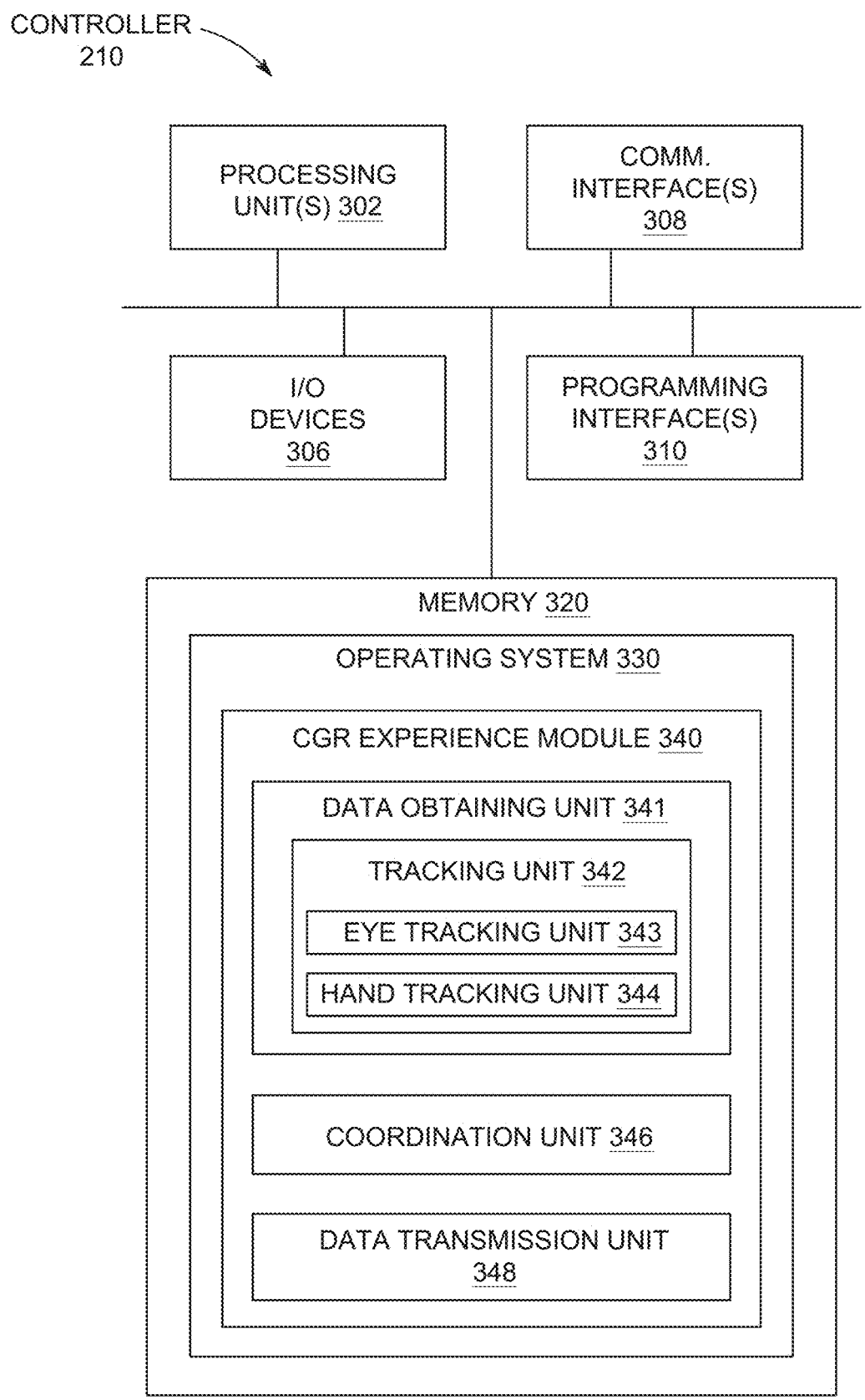
FIG. 27 illustrates one embodiment of the present invention of a display generation component of a computer system to provide a visual component of the CGR experience to the user.

FIG. 27 illustrates one embodiment for a block diagram of controller 210. Controller 210 can include one or more processing units 302 (e.g., microprocessors, application-specific integrated-circuits (ASICs), field-programmable gate arrays (FPGAs), graphics processing units (GPUs), central processing units (CPUs), processing cores, and/or the like), one or more input/output (I/O) devices 306, one or more communication interfaces 308 (e.g., universal serial bus, global system for mobile communications (GSM), code division multiple access (CDMA), time division multiple access (TDMA), global positioning system (GPS), infrared (IR), BLUETOOTH, ZIGBEE, and/or the like type interface), one or more programming (e.g., I/O) interfaces 310, a memory 320, and one or more communication buses 304 for interconnecting these and various other components.

In one embodiment, the one or more communication buses 304 include circuitry that interconnects and controls communications between system components. In some embodiments, the one or more I/O devices 306 include at least one of a keyboard, a mouse, a touchpad, a joystick, one or more microphones, one or more speakers, one or more image sensors, one or more displays, and/or the like.

In one embodiment, memory 320 includes high-speed random-access memory, such as dynamic random-access memory (DRAM), static random-access memory (SRAM), double-data-rate random-access memory (DDR RAM), or other random-access solid-state memory devices. In some embodiments, the memory 320 includes non-volatile memory, such as one or more magnetic disk storage devices, optical disk storage devices, flash memory devices, or other non-volatile solid-state storage devices. The memory 320 can include\ one or more storage devices remotely located from the one or more processing units 302. In one embodiment, memory 320 is a non-transitory computer readable storage medium. In one embodiment, memory 320 or the non-transitory computer readable storage medium of the memory 320 stores the following programs, modules and data structures, or a subset thereof including an optional operating system 330 and a CGR experience module 340.

In one embodiment, operating system 330 includes instructions for handling various basic system services and for performing hardware dependent tasks. In some embodiments, the CGR experience module 340 is configured to manage and coordinate one or more CGR experiences for one or more users (e.g., a single CGR experience for one or more users, or multiple CGR experiences for respective groups of one or more users). To that end, in various embodiments, the CGR experience module 340 includes a data obtaining unit 342, a 3 unit 344, a coordination unit 346, and a data transmitting unit 348.

In one embodiment, data obtaining unit 342 is configured to obtain data (e.g., presentation data, interaction data, sensor data, location data, etc.) from at least the display generation component 220, and optionally one or more of the input devices 225, output devices 255, sensors 290, and/or peripheral devices 295. As a non-limiting example, data obtaining unit 342 includes instructions and/or logic therefor, and heuristics and metadata therefor.

In one embodiment, tracking unit 344 is configured to map the scene 205 and to track the position/location of at least the display generation component 220 with respect to the scene 205, and optionally, to one or more of the input devices 225, output devices 255, sensors 290, and/or peripheral devices 295. To that end, in various embodiments, the tracking unit 244 includes instructions and/or logic therefor, and heuristics and metadata therefor. In some embodiments, the tracking unit 344 includes hand tracking unit 243 and/or eye tracking unit 245. In some embodiments, the hand tracking unit 343 is configured to track the position/location of one or more portions of the user's hands, and/or motions of one or more portions of the user's hands with respect to the scene 205 relative to the display generation component 220, and/or relative to a coordinate system defined relative to the user's hand. As a non-limiting example, the eye tracking unit 345 is configured to track the position and movement of the user's gaze (or more broadly, the user's eyes, face, or head) with respect to the scene 205 (e.g., with respect to the physical environment and/or to the user (e.g., the user's hand)) or with respect to the CGR content displayed via the display generation component 220.

In one embodiment, coordination unit 346 is configured to manage and coordinate the CGR experience presented to the user by the display generation component 220, and optionally, by one or more of the output devices 255 and/or peripheral devices 295. Coordination unit 346 can include instructions and/or logic therefor, and heuristics and metadata therefor.

In one embodiment, data transmitting unit 348 is configured to transmit data (e.g., presentation data, location data, etc.) to at least the display generation component 220, and optionally, to one or more of the input devices 225, output devices 255, sensors 290, and/or peripheral devices 295. As a non-limiting example, data transmitting unit 348 includes instructions and/or logic therefor, and heuristics and metadata therefor.

Although the data obtaining unit 342, the tracking unit 344 (e.g., including the eye tracking unit 343 and the hand tracking unit 344), the coordination unit 346, and the data transmitting unit 348 are shown as residing on a single device (e.g., the controller 210), it should be understood that in other embodiments, any combination of the data obtaining unit 342, the tracking unit 344 (e.g., including the eye tracking unit 343 and the hand tracking unit 344), the coordination unit 346, and the data transmitting unit 348 may be located in separate computing devices.

FIG. 27 provides a functional description of the various features that may be present in a particular implementation as opposed to a structural schematic of the embodiments described herein. In one embodiment, some functional modules shown separately in FIG. 27 can be executed in a single module and the various functions of single functional blocks could be implemented by one or more functional blocks in various embodiments. The actual number of modules and the division of particular functions and how features are allocated among them can vary from one embodiment to another and, in some embodiments, depends in part on the particular combination of hardware, software, and/or firmware chosen for a particular implementation.

Figure 28:
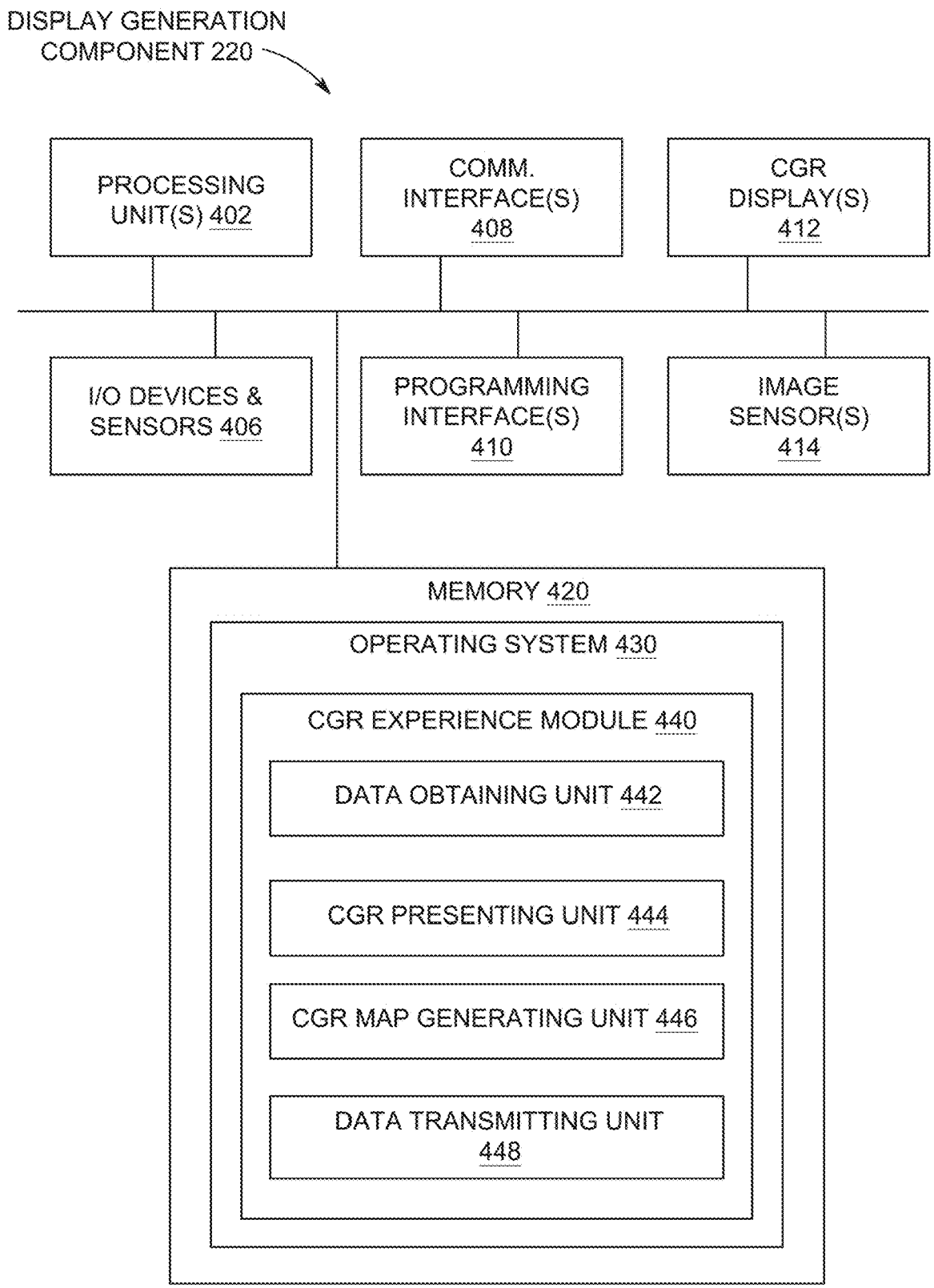
FIG. 28 illustrates one embodiment of the present invention with a hand tracking unit to capture gesture inputs of a user.

FIG. 28 illustrates one embodiment of a block diagram of display generation component 220. As non-limiting examples, HMD 220 includes one or more processing units 402 (e.g., microprocessors, ASICs, FPGAs, GPUs, CPUs, processing cores, and/or the like), one or more input/output (I/O) devices and sensors 406, one or more communication interfaces 408, one or more programming (e.g., I/O) interfaces 410, one or more CGR displays 412, one or more optional interior- and/or exterior-facing image sensors 414, a memory 420, and one or more communication buses 404 for interconnecting these and various other components.

In one embodiment, communication buses 404 include circuitry that interconnects and controls communications between system components. As a non-limiting example, one or more I/O devices and sensors 406 can include at least one of an inertial measurement unit (IMU), an accelerometer, a gyroscope, a thermometer, one or more physiological sensors (e.g., blood pressure monitor, heart rate monitor, blood oxygen sensor, blood glucose sensor, etc.), one or more microphones, one or more speakers, a haptics engine, one or more depth sensors (e.g., a structured light, a time-of-flight, or the like), and/or the like.

As a non-limiting example, CGR display 412 provides the CGR experience to the user. In various embodiments, CGR displays 412 correspond to holographic, digital light processing (DLP), liquid-crystal display (LCD), liquid-crystal on silicon (LCoS), organic light-emitting field-effect transitory (OLET), organic light-emitting diode (OLED), surface-conduction electron-emitter display (SED), field-emission display (FED), quantum-dot light-emitting diode (QD-LED), micro-electro-mechanical system (MEMS), and/or the like display types. In some embodiments, CGR displays 412 correspond to diffractive, reflective, polarized, holographic, etc. waveguide displays. As a non-limiting example, HMD 220 includes a single CGR display 412. In one embodiment, HMD 120 includes CGR display 412 for each eye of the user.

As non-limiting examples, image sensors 414 obtain image data that corresponds to at least a portion of the face of the user that includes the eyes of the user (and may be referred to as an eye-tracking camera). In one embodiment, image sensors 414 obtain image data that corresponds to at least a portion of the user's hand(s) and optionally arm(s) of the user (and may be referred to as a hand-tracking camera). In one embodiment, image sensors 414 are forward-facing so as to obtain image data that corresponds to the scene as would be viewed by the user if the HMD 220 was not present (and may be referred to as a scene camera). Image sensors 414 can include one or more RGB cameras (e.g., with a complimentary metal-oxide-semiconductor (CMOS) image sensor or a charge-coupled device (CCD) image sensor), one or more infrared (IR) cameras, one or more event-based cameras, and/or the like.

As shown in FIG. 28, memory 420 includes high-speed random-access memory, such as DRAM, SRAM, DDR RAM, or other random-access solid-state memory devices. In one embodiment, memory 420 includes non-volatile memory, such as one or more magnetic disk storage devices, optical disk storage devices, flash memory devices, or other non-volatile solid-state storage devices. Memory 420 can include a non-transitory computer readable storage medium.

In one embodiment, operating system 430 includes instructions for handling various basic system services and for performing hardware dependent tasks. In one embodiment, the CGR presentation module 440 is configured to present CGR content to the user via the one or more CGR displays 412. In various embodiments, the CGR presentation module 440 includes a data obtaining unit 442, a CGR presenting unit 444, a CGR map generating unit 446, and a data transmitting unit 448.

In one embodiment, data obtaining unit 442 obtains data (e.g., presentation data, interaction data, sensor data, location data, etc.) from at least the controller 210. AS a non-limiting example, data obtaining unit 442 includes instructions and/or logic therefor, and heuristics and metadata therefor.

In one embodiment, CGR presenting unit 444 is configured to present CGR content via the one or more CGR displays 412. To that end, in various embodiments, the CGR presenting unit 444 includes instructions and/or logic therefor, and heuristics and metadata therefor.

In one embodiment, the CGR map generating unit 446 is configured to generate a CGR map (e.g., a 3D map of the mixed reality scene or a map of the physical environment into which computer generated objects can be placed to generate the computer generated reality) based on media content data. To that end, in various embodiments, the CGR map generating unit 446 includes instructions and/or logic therefor, and heuristics and metadata therefor.

In one embodiment, the data transmitting unit 448 is configured to transmit data (e.g., presentation data, location data, etc.) to at least controller 210, and optionally one or more of the input devices 225, output devices 255, sensors 290, and/or peripheral devices 295. In one embodiment, data transmitting unit 448 includes instructions and/or logic therefor, and heuristics and metadata therefor.

Figure 29:
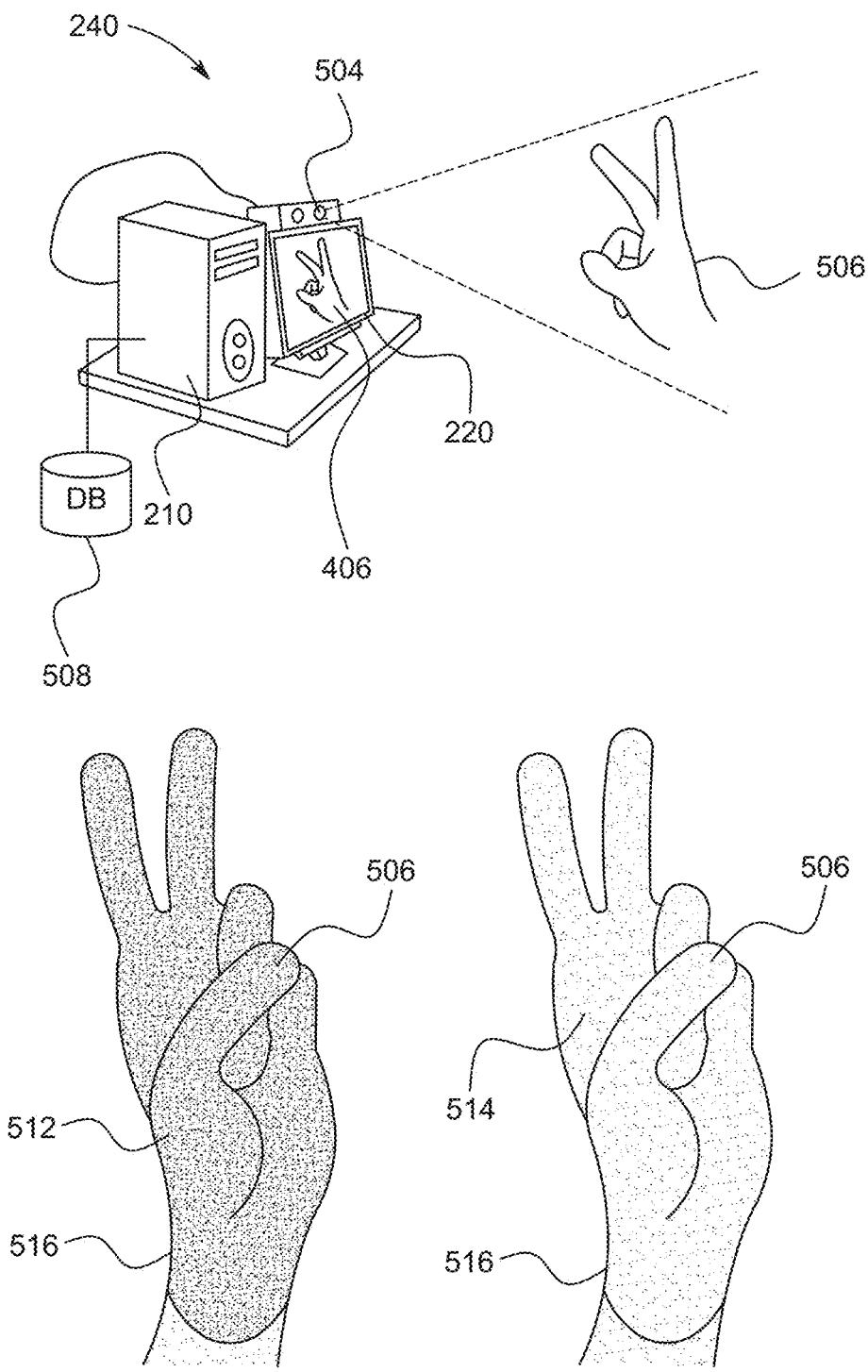
FIG. 29 illustrates one embodiment of an eye tracking unit to capture gaze inputs of a user.

FIG. 29 illustrates one of the hand tracking device 240. In one embodiment, hand tracking device 240 controlled by hand tracking unit 343 (FIG. 27) to track the position/location of one or more portions of the user's hands, and/or motions of one or more portions of the user's hands with respect to the scene with respect to a portion of the physical environment surrounding the user, with respect to display generation component, or with respect to a portion of the user (e.g., the user's face, eyes, or head), and/or relative to a coordinate system defined relative to the user's hand.

In one embodiment, hand tracking device 340 is part of the display generation component 220 (e.g., embedded in or attached to a head-mounted device). In one embodiment, the hand tracking device 240 is separate from the display generation component 220.

In one embodiment, hand tracking device 240 includes image sensors (e.g., one or more IR cameras, 3D cameras, depth cameras, and/or color cameras, etc.) that capture three-dimensional scene information that includes at least a hand 506 of a human user. Image sensors capture the hand images with sufficient resolution to enable the fingers and their respective positions to be distinguished. As a non-limiting example, image sensors capture images of other parts of the user's body, as well, or possibly all of the body, and may have either zoom capabilities or a dedicated sensor with enhanced magnification to capture images of the hand with the desired resolution. In one embodiment, image sensors also capture 2D color video images of the hand 506 and other elements of the scene. In one embodiment, the image sensors are used in conjunction with other image sensors to capture the physical environment of the scene 205, or serve as the image sensors that capture the physical environment of the scene 205. In one embodiment, the image sensors are positioned relative to the user or the user's environment in a way that a field of view of the image sensors or a portion thereof is used to define an interaction space in which hand movement captured by the image sensors are treated as inputs to controller 210.

In one embodiment, image sensors output a sequence of frames containing 3D map data (and possibly color image data, as well) to controller 210, which extracts high-level information from the map data. This high-level information can be provided via Application Program Interface (API) to an application running on the controller, which drives the display generation component 220 accordingly. The user may interact with software running on the controller 210 by moving his hand 506 and changing its hand posture.

In one embodiment, the image sensors 404 project a pattern of spots onto a scene containing the hand 406 and captures an image of the projected pattern. In one embodiment, the controller 110 computes the 3D coordinates of points in the scene (including points on the surface of the user's hand) by triangulation, based on transverse shifts of the spots in the pattern. This approach is advantageous in that it does not require the user to hold or wear any sort of beacon, sensor, or other marker. It gives the depth coordinates of points in the scene relative to a predetermined reference plane, at a certain distance from the image sensors 404. In the present disclosure, the image sensors 404 are assumed to define an orthogonal set of x, y, z axes, so that depth coordinates of points in the scene correspond to z components measured by the image sensors. Alternatively, the hand tracking device 440 may use other methods of 3D mapping, such as stereoscopic imaging or time-of-flight measurements, based on single or multiple cameras or other types of sensors.

In one embodiment, the hand tracking device 240 captures and processes a temporal sequence of depth maps containing the user's hand, while the user moves his hand (e.g., whole hand or one or more fingers). Software running on a processor in the image sensors 604 and/or the controller 210 processes the 3D map data to extract patch descriptors of the hand in these depth maps. The software matches these descriptors to patch descriptors stored in a database 408, based on a prior learning process, in order to estimate the pose of the hand in each frame. The pose typically includes 3D locations of the user's hand joints and finger tips.

The software may also analyze the trajectory of the hands and/or fingers over multiple frames in the sequence in order to identify gestures. The pose estimation functions described herein may be interleaved with motion tracking functions, so that patch-based pose estimation is performed only once in every two (or more) frames, while tracking is used to find changes in the pose that occur over the remaining frames. The pose, motion and gesture information are provided via the above-mentioned API to an application program running on the controller 110. This program may, for example, move and modify images presented on the display generation component 120, or perform other functions, in response to the pose and/or gesture information.

In one embodiment, the software may be downloaded to the controller 110 in electronic form, over a network, for example, or it may alternatively be provided on tangible, non-transitory media, such as optical, magnetic, or electronic memory media. In one embodiment, the database 408 is likewise stored in a memory associated with the controller 110. Alternatively or additionally, some or all of the described functions of the computer may be implemented in dedicated hardware, such as a custom or semi-custom integrated circuit or a programmable digital signal processor (DSP). Although the controller 110 is shown in FIG. 4, by way of example, as a separate unit from the image sensors 440, some or all of the processing functions of the controller may be performed by a suitable microprocessor and software or by dedicated circuitry within the housing of the hand tracking device 402 or otherwise associated with the image sensors 404. In one embodiment, at least some of these processing functions may be carried out by a suitable processor that is integrated with the display generation component 120 (e.g., in a television set, a handheld device, or head-mounted device, for example) or with any other suitable computerized device, such as a game console or media player. The sensing functions of image sensors 404 may likewise be integrated into the computer or other computerized apparatus that is to be controlled by the sensor output.

FIG. 29 includes a schematic representation of a depth map 510 captured by the image sensors 504, in accordance with some embodiments. The depth map, as explained above, comprises a matrix of pixels having respective depth values. The pixels 512 corresponding to the hand 506 have been segmented out from the background and the wrist in this map. The brightness of each pixel within the depth map 510 corresponds inversely to its depth value, i.e., the measured z distance from the image sensors 504, with the shade of gray growing darker with increasing depth. The controller 210 processes these depth values in order to identify and segment a component of the image (i.e., a group of neighboring pixels) having characteristics of a human hand. These characteristics, may include, for example, overall size, shape and motion from frame to frame of the sequence of depth maps 510.

In one embodiment, a hand skeleton 514 that controller 210 ultimately extracts from the depth map 510 of the hand 506. Skeleton 514 is superimposed on a hand background 516 that has been segmented from the original depth map. In some embodiments, key feature points of the hand (e.g., points corresponding to knuckles, finger tips, center of the palm, end of the hand connecting to wrist, etc.) and optionally on the wrist or arm connected to the hand are identified and located on hand skeleton 514. In some embodiments, location and movements of these key feature points over multiple image frames are used by the controller 110 to determine the hand gestures performed by the hand or the current state of the hand, in accordance with some embodiments.

Figure 30:
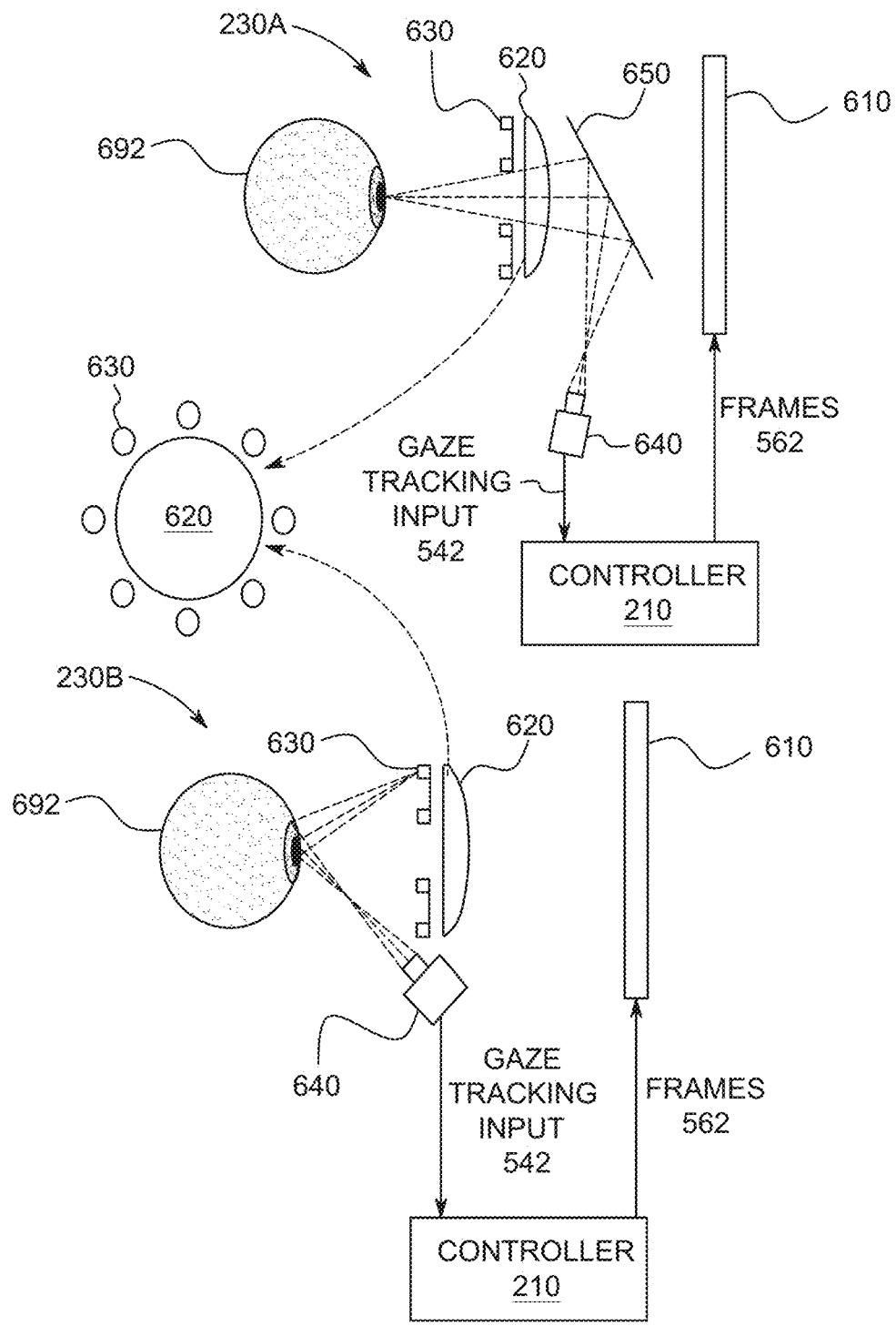
FIG. 30 illustrates one embodiment of the present invention.

FIG. 30 illustrates one embodiment of eye tracking device 230. Eye tracking device 230 is controlled by the eye tracking unit 345 to track the position and movement of the user's gaze with respect to scene 205 or with respect to the CGR content displayed via the display generation component 220. Eye tracking device 130 can be integrated with display generation component 220.

In one embodiment, the display generation component 120 uses a display mechanism (e.g., left and right near-eye display panels) for displaying frames including left and right images in front of a user's eyes to thus provide 3D virtual views to the user. For example, a head-mounted display generation component may include left and right optical lenses (referred to herein as eye lenses) located between display and the user's eyes. Gaze tracking device 230 can capture images of the user's eyes, analyze the images to generate gaze tracking information, and communicate the gaze tracking information to the controller 210.

Eye tracking device 230 (e.g., 230A or 230B) can include eye lens(es) 620, and a gaze tracking system that includes at least one eye tracking camera 640 (e.g., infrared (IR) or near-IR (NIR) cameras) positioned on a side of the user's face for which eye tracking is performed, and an illumination source 630 (e.g., IR or NIR light sources such as an array or ring of NIR light-emitting diodes (LEDs)) that emit light (e.g., IR or NIR light) towards the user's eye(s) 692. The eye tracking cameras 640 may be pointed towards mirrors 650 located between the user's cyc(s) 692 and a display 610 (e.g., a left or right display panel of a head-mounted display, or a display of a handheld device, a projector, and the like.)

In one embodiment, the controller 210 renders AR or VR frames 662 (e.g., left and right frames for left and right display panels) and provide the frames 662 to the display 610. The controller 110 uses gaze tracking input 642 from the eye tracking cameras 640 for various purposes, for example in processing the frames 662 for display. Controller 210 can estimate the user's point of gaze on display 610 based on the gaze tracking input 642 obtained from the eye tracking cameras 640 using the glint-assisted methods or other suitable methods. The point of gaze estimated from the gaze tracking input 642 is optionally used to determine the direction.

In one embodiment, illustrated in FIG. 30, an apparatus 710 is provided to receive a three dimensional (3D) map 712 of at least a part of a body of a user. A light emitting device 714 is included with tunable VCSEL laser 10 with one or more active regions 14 having quantum wells and barriers 16. The active regions are surrounded by one or more p-n junctions 18. The one or more active regions 14 can include a selected shape structure 26. One or more tunnel junctions (TJ) 20 are provided. One or more apertures 24 are provided with the selected shape structure 26. One or more buried tunnel junctions (BTJ) 28 or oxide confine the apertures, additional TJ's 20, planar structures and or additional BTJ's 28 created during a regrowth process that is independent of a first growth process. A VCSEL output 38 is determined in response to an application of the VCSEL laser 10. The VCSEL laser i10 includes an HCG grating 34 and a bottom DBR 12 A user monitoring device 100 includes the VCSEL laser 10. A user monitoring device 716 that includes the VCSEL laser 10. The light emitting device is included in a camera of a communication device.

In one embodiment, the output 38 of the VCSEL laser has a long wavelength, including but not limited to from 1 micron to 1.7 microns, and in one instance, 1.365 microns.

In one embodiment, the output 38 of the VCSEL laser is a long wavelength, at least partially created from indium phosphide structure or material in the VCSEL laser 10. As a non-limiting example, VCSEL laser 10 can include an indium phosphide substrate 46, or a substrate 46 that at least partially includes indium phosphide.

In one embodiment, VCSEL laser 10 is coupled to or includes a top DBR 42 or high contrast grating (HCG) 34. As a non-limiting example, bottom DBR 12 is a semiconductor DBR or a combination of a semiconductor DBR with a dielectric coating. In this manner, VCSEL 10 can include a dielectric coating. As a non-limiting example, the dielectric coating improves a broadening of a tuning range of the VCSEL laser 10.

In one embodiment, VCSEL laser 10 operates in a single mode or a multi-mode operation. As a non-limiting example, dimensions of the aperture and HCG 34 are contributing factors to the single mode operation.

In one embodiment, VCSEL laser 10 can deploy multiple tunnel junctions to enhance the output 38 of VCSEL laser 10.

As a non-limiting example, buried tunnel junctions (BTJ) improve an energy efficiency of VCSEL laser 10.

As a non-limiting example, a wavelength of the VCSEL laser output 38 can be swept to provide improved resolution. In one embodiment, the VCSEL laser output 38 is swept by modulating a HCG grating 34 up and down, e.g., its up and down movement relative to a top of VCSEL laser 10, wherein when the HCG 34 moves closes to non-extended portion relative to a top of VCSEL laser 10, a wavelength of the output 38 changes and returns closer to an original output 38 of the VCSEL laser, without extension of the grating.

In one embodiment, a mem's structure is coupled to the HCG grating 34 or top DBR 42 to create a swept source. As a non-limiting example, modulating a VCSEL laser output 38, in combination with a sweeping of wavelengths of the VCSEL laser output 38 allows for higher resolution and reduces at least a portion of atmospheric interference of VCSEL laser operation.

In one embodiment, multiple tunnel junctions increase an optical power of the VCSEL laser 19. These junctions are provided in a body of the VCSEL laser 10.

In one embodiment, a semiconductor optical amplifier is included with a modulator to allow a swept source to be modulated. As a non-limiting example, the modulation of the VCSEL laser turning the VCSEL laser on and off. As a non-limiting example, the modulation is from about 1 to 50 G. In another embodiment, the modulation is greater than 50 G.

As a non-limiting example, an optical photonic integrated circuit (PIC) is coupled to the VCSEL laser. The VCSEL laser can be mounted on the PIC. In one embodiment, a plurality of VCSEL lasers are mounted on the PIC.

In one embodiment, HCG 34 acts as a partial mirror. As a non-limiting example, HCG 34 can operate as a second mirror HCG 34 is positioned at the top of the vertical resonator cavity 32, following removal of at least a portion of the sacrificial layer 44. HCG 34 is positioned at the top of the vertical resonator cavity 32. As a non-limiting example, HCG 34 is positioned on a top of the mesa, in one embodiment, a plurality of support elements, anchors, hold HCG 34 in place. HCG 34 then moves, typically up and down relative to cavity 32.

Two or more support elements are provided. Support elements provide support for HCG 34. As a non-limiting example, support elements can have dimensions of 50 microns long, one micron wide. Their thickness is determined by a growth of HCG 34 layer. Superficial layer 44 is defined by epitaxial growth. As a non-limiting example, HCG deformation is provided under different points of operation. For broad tuning, HCG 34 deforms and moves away from cavity 32. A period and duty cycle of HCG 34 are determined by the amount of deformation. As a non-limiting example, a thickness of support elements define their function. A modification of support elements occurs when there is an actuation. This causes support elements to bend and HCG 34 deforms. In one embodiment, the support elements 45 are not straight beams. In various embodiments, there can be variations of support elements to modify HCG 34 deformation.

A good portion of sacrificial layer 44 is substantially removed, at least a portion creating anchors for HCG 34.

As a non-limiting example, a main actuation of HCG 34 can include but not be limited to: electrooptic, with an application of voltage across the surface of HCG 34, thermal, piezoelectric and the like, an air gap is between the top surface of vessel laser 10 and HCG 34. Top DBR is not necessary.

When a voltage is applied, anchors do not allow current to flow over and cause HCG 34 to move. This creates charging between HCG 34 and the mesa 122. When voltage is increased, an attraction vis electro static actuation can be increased. As a non-limiting example, actuation is achieved with piezoelectric, thermal and the like. This provides tuning that depends of the wavelength and power. In one embodiment, tuning up to 100 nm is provided.

In one embodiment, electrostatic actuation is used by application of a voltage

As a non-limiting example, less than 1% of the output beam is emitted from vesel laser 10.

The remaining portions of sacrificial layer 44 not removed provide anchoring points for HCG 34. As a non-limiting example, portions of the sacrificial layer 44 remain to provide anchoring in order for HCG 34 to move.

There can be two or more support elements coupled to a remaining portion of sacrificial layer 44. In one embodiment, four support elements are provided. Different directions of moving HCG 34 are provided. In various embodiments, HCG 34 can have a variety of different geometries, including but not limited to hexagonal, octagonal, a double frame design and the like.

In one embodiment, the output 38 of the VCSEL laser has a long wavelength, including but not limited to from 1 micron to 1.7 microns, and in one instance, 1.365 microns.

In one embodiment, the output 38 of the VCSEL laser is a long wavelength, at least partially created from indium phosphide structure or material in the VCSEL laser 10. As a non-limiting example, VCSEL laser 10 can include an indium phosphide substrate, or a substrate that at least partially includes indium phosphide.

In one embodiment, VCSEL laser 10 is coupled to or includes a top DBR 42 or high contrast grating (HCG) 34. As a non-limiting example, bottom DBR 12 is a semiconductor DBR or a combination of a semiconductor DBR with a dielectric coating. In this manner, VCSEL 10 can include a dielectric coating. As a non-limiting example, the dielectric coating improves a broadening of a tuning range of the VCSEL laser 10.

In one embodiment, VCSEL laser 10 operates in a single mode or a multi-mode operation. As a non-limiting example, dimensions of the aperture and HCG 34 are contributing factors to the single mode operation.

In one embodiment, VCSEL laser 10 can deploy multiple tunnel junctions to enhance the output 38 of VCSEL laser 10.

As a non-limiting example, buried tunnel junctions (BTJ) improve an energy efficiency of VCSEL laser 10.

As a non-limiting example, a wavelength of the VCSEL laser output 38 can be swept to provide improved resolution. In one embodiment, the VCSEL laser output 38 is swept by modulating a HCG grating 34 up and down, e.g., its up and down movement relative to a top of VCSEL laser 10, wherein when the HCG 34 moves closes to non-extended portion relative to a top of VCSEL laser 10, a wavelength of the output 38 changes and returns closer to an original output 38 of the VCSEL laser, without extension of the grating.

In one embodiment, a mem's structure is coupled to the HCG grating 34 or top DBR 42 to create a swept source. As a non-limiting example, modulating a VCSEL laser output 38, in combination with a sweeping of wavelengths of the VCSEL laser output 38 allows for higher resolution and reduces at least a portion of atmospheric interference of VCSEL laser operation.

In one embodiment, multiple tunnel junctions increase an optical power of the VCSEL laser 19. These junctions are provided in a body of the VCSEL laser 10.

In one embodiment, a semiconductor optical amplifier is included with a modulator to allow a swept source to be modulated. As a non-limiting example, the modulation of the VCSEL laser turning the VCSEL laser on and off. As a non-limiting example, the modulation is from about 1 to 50 G. In another embodiment, the modulation is greater than 50 G.

It is to be understood that the present disclosure is not to be limited to the specific examples illustrated and that modifications and other examples are intended to be included within the scope of the appended claims. Moreover, although the foregoing description and the associated drawings describe examples of the present disclosure in the context of certain illustrative combinations of elements and/or functions, it should be appreciated that different combinations of elements and/or functions may be provided by alternative implementations without departing from the scope of the appended claims. Accordingly, parenthetical reference numerals in the appended claims are presented for illustrative purposes only and are not intended to limit the scope of the claimed subject matter to the specific examples provided in the present disclosure.

Additional details are provided in U.S. Pat. No. 8,593,564, incorporated herein by reference.

The invention claimed is:

1. A system adapted to receive a three-dimensional (3D) map of at least a part of a body of a user, comprising:
   a tunable VCSEL including:
   a first mirror;
   one or more active regions with a first active region adjacent to the first mirror, each of an active region including quantum wells and barriers, each of an active region surrounded by one or more p-n junctions, the one or more active regions including a selected shape structure each with a tunnel junction (TJ);
   one or more apertures provided with the selected shape structure;
   one or more buried tunnel junctions (BTJ), additional TJ's, planar structures and/or additional BTJ's are created during a regrowth process that is independent of a first growth process of the first mirror, the active region and the one or more TJs;
   one or more electrical confinement apertures defined by the one or more BT's, additional TJ's, planar structures and/or additional BTJ;
   a vertical resonator cavity disposed over the electrical confinement aperture;
   a high contrast grating (HCG) operating as a second mirror positioned over the vertical resonator cavity, the HCG configured to reflect a first portion of light back into the vertical resonator cavity, and a second portion of the light as an output beam from the tunable, the HCG structure being layered on the selected shape structure;
   wherein a shape of the output beam of the tunable VCSEL laser is determined by a geometric shape of the one or more BTJ apertures, apertures for additional TJ's, planar structures and/or additional BTJ's, with a transmission function of the HCG and is designed according to the desired optical transmission function of the application; and
   a user monitoring device that includes the tunable VCSEL laser; and wherein the tunable VCSEL laser can be separate or is included in a camera of a communication device.

2. The system of claim 1, wherein the output of the tunable VCSEL laser has a long wavelength.

3. The system of claim 2, wherein the long wavelength is from 1 micron to 1.7 microns.

4. The system of claim 3, wherein the long wavelength is 1.365 microns.

5. The system of claim 4, wherein the tunable VCSEL laser includes an indium phosphide substrate.

6. The system of claim 3, wherein the output of the tunable VCSEL laser is a long wavelength, at least partially created from indium phosphide structure in the laser structure.

7. The system of claim 1, wherein the tunable VCSEL laser includes or is coupled to a top DBR or a high contrast grating (HCG).

8. The system of claim 1, wherein a bottom DBR is a semiconductor DBR or a combination of a semiconductor DBR with a dielectric coating.

9. The system of claim 1, wherein the tunable VCSEL laser includes a dielectric coating.

10. The system of claim 9, wherein the dielectric coating improves a broadening of a tuning range of the tunable VCSEL laser.

11. The system of claim 1, wherein the tunable VCSEL laser operates in a single mode or a multi-mode operation.

12. The system of claim 11, wherein dimensions of the one of more apertures and HCG are contributing factors to a single mode operation.

13. The system of claim 1, wherein the tunable VCSEL laser operates in a single mode.

14. The system of claim 1, wherein the tunable VCSEL laser can deploy multiple tunnel junctions to enhance the output of the tunable VCSEL laser.

15. The system of claim 1, wherein buried tunnel junctions improve an energy efficiency of the tunable VCSEL laser.

16. The system of claim 15, further comprising:
   a sweep source to provide that wherein the tunable VCSEL laser output is swept by modulating the HCG grating up and down, wherein when the HCG moves closes to a bottom portion of the tunable VCSEL laser a wavelength changes and returns closer to an original output of the tunable VCSEL laser.

17. The system of claim 15, wherein the tunable VCSEL laser output is swept by modulating a HCG grating up and down, wherein when the HCG moves closes to its non-extended original position, tunable VCSEL the output wavelength(s) of the tunable VCSEL laser changes and returns closer to an original output of the tunable VCSEL laser when the HCG is not extended.

18. The system of claim 1, wherein a wavelength of the tunable VCSEL laser output can be swept to provide improved resolution.

19. The system of claim 1, further comprising:
   a mem's structure coupled to the HCG grating or top DBR to create a swept source.

20. The system of claim 1, wherein multiple tunnel junctions are provided that increase an optical power of the tunable VCSEL laser.

* * * * *